US012648481B2

(12) United States Patent
Chung et al.

(10) Patent No.:     US 12,648,481 B2
(45) Date of Patent:          Jun. 2, 2026

(54) DISPLAY MODULE AND DISPLAY APPARATUS HAVING THE SAME

(71) Applicant: SAMSUNG ELECTRONICS CO., LTD., Suwon-si (KR)

(72) Inventors: Changkyu Chung, Suwon-si (KR); Changsun Kang, Suwon-si (KR); Huigyeong Ahn, Suwon-si (KR); Kyungwoon Jang, Suwon-si (KR); Sangtae Han, Suwon-si (KR); Daesuck Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 723 days.

(21) Appl. No.: 17/902,611

(22) Filed:     Sep. 2, 2022

(65)            Prior Publication Data

US 2022/0415873 A1     Dec. 29, 2022

Related U.S. Application Data

(63) Continuation of application No. PCT/KR2021/016317, filed on Nov. 10, 2021.

(30)        Foreign Application Priority Data

Nov. 11, 2020    (KR) ........................ 10-2020-0150030

(51) Int. Cl.
    *H01L 27/14*         (2006.01)
    *G09G 3/20*          (2006.01)
    (Continued)
(52) U.S. Cl.
    CPC .......... *H10W 90/00* (2026.01); *G09G 3/2096* (2013.01); *G09G 3/32* (2013.01);
    (Continued)

(58) Field of Classification Search
    CPC .............. H10H 20/00–882; H10H 29/00–142; H10H 29/30–962
    See application file for complete search history.

(56)            References Cited

U.S. PATENT DOCUMENTS 9,818,725 B2    11/2017  Bower et al.
10,546,796 B2    1/2020  Hu et al.
(Continued)

FOREIGN PATENT DOCUMENTS

CN        103996676 A      8/2014
CN        108231834 A      6/2018
(Continued)

OTHER PUBLICATIONS

Communication dated Dec. 11, 2023, issued by the European Patent Office in European Application No. 21892311.8.
(Continued)

*Primary Examiner* — Ismail A Muse
(74) *Attorney, Agent, or Firm* — Sughrue Mion, PLLC

(57)            ABSTRACT

A display module includes a first substrate; a plurality of micro-pixel packages provided on an upper surface of the first substrate and including a plurality of pixels arranged in two dimensions; a plurality of micro-pixel controllers provided on the upper surface of the first substrate and configured to control the plurality of micro-pixel packages; and a driver integrated chip (IC) configured to transmit a driving signal to the plurality of micro-pixel controllers, wherein upper ends of the plurality of micro-pixel packages are positioned higher than upper ends of the plurality of micro-pixel controllers with respect to the upper surface of the first substrate.

13 Claims, 41 Drawing Sheets

(51) Int. Cl.

| | |
|---|---|
| *G09G 3/32* | (2016.01) |
| *H01L 29/04* | (2006.01) |
| *H01L 29/15* | (2006.01) |
| *H01L 31/036* | (2006.01) |
| *H10H 20/857* | (2025.01) |
| *H10W 90/00* | (2026.01) |
| *H10W 72/90* | (2026.01) |

(52) U.S. Cl.

CPC ... *H10H 20/857* (2025.01); *G09G 2300/0842* (2013.01); *H10W 72/90* (2026.01); *H10W 90/794* (2026.01)

(56) References Cited

U.S. PATENT DOCUMENTS

| | | | |
|---|---|---|---|
| 10,692,947 | B2 | 6/2020 | Kim et al. |
| 11,676,953 | B2 * | 6/2023 | Bibi .......................... G04G 9/10 257/82 |
| 2006/0171596 | A1 * | 8/2006 | Sung .................... H04N 19/105 375/E7.184 |
| 2016/0351539 | A1 * | 12/2016 | Bower ................ H01L 25/0655 |
| 2018/0102492 | A1 * | 4/2018 | Bibl .................... H01L 21/6835 |
| 2018/0277528 | A1 | 9/2018 | Hasegawa et al. |
| 2019/0027534 | A1 | 1/2019 | Rotzoll et al. |
| 2019/0115274 | A1 * | 4/2019 | Hu .......................... H01L 24/16 |
| 2019/0206330 | A1 * | 7/2019 | Kim ..................... G09G 3/3233 |
| 2019/0244942 | A1 | 8/2019 | Yamaguchi et al. |
| 2019/0325803 | A1 | 10/2019 | Chen et al. |
| 2020/0020676 | A1 | 1/2020 | Cok et al. |
| 2021/0043618 | A1 * | 2/2021 | Bower ................... H10H 29/10 |
| 2021/0080777 | A1 * | 3/2021 | Mo ..................... G02F 1/13394 |
| 2021/0135070 | A1 * | 5/2021 | Rinne ................. H01L 25/0753 |

FOREIGN PATENT DOCUMENTS

| | | | |
|---|---|---|---|
| JP | 202052404 | A | 4/2020 |
| KR | 10-1689312 | B1 | 12/2016 |
| KR | 10-1820258 | B1 | 1/2018 |
| KR | 10-2018-0051006 | A | 5/2018 |
| KR | 10-1943257 | B1 | 4/2019 |
| KR | 10-1971979 | B1 | 4/2019 |
| KR | 10-2020-0088026 | A | 7/2020 |
| KR | 10-2020-0097941 | A | 8/2020 |
| KR | 10-2021-0004324 | A | 1/2021 |
| WO | 2017/142817 | A1 | 8/2017 |
| WO | 2020/166814 | A1 | 8/2020 |

OTHER PUBLICATIONS

International Search Report (PCT/ISA/210) issued Mar. 3, 2022 by the International Searching Authority in counterpart International Application No. PCT/KR2021/016317.

Communication dated Dec. 5, 2025, issued by the China National Intellectual Property Administration in Chinese Application No. 202180062284.5.

Communication dated Jan. 12, 2026, issued by the Korean Ministry of Intellectual Property in Korean Application No. 10-2020-0150030.

Communication dated Jul. 21, 2025, issued by the China National Intellectual Property Administration in Chinese Application No. 202180062284.5.

* cited by examiner

START

FORM WIRING AND ELECTRODE PAD
ON MODULE SUBSTRATE ~2011

DISPOSE MICRO-PIXEL CONTROLLER
ON UPPER SURFACE
OF PACKAGE SUBSTRATE ~2012

FORM BUFFER LAYER
ON MICRO-PIXEL CONTROLLER ~2013

TRANSFER INORGANIC LED
ONTO BUFFER LAYER ~2014

END

DISPLAY MODULE AND DISPLAY APPARATUS HAVING THE SAME

CROSS-REFERENCE TO RELATED APPLICATIONS

This application is bypass continuation of International Application No. PCT/KR2021/016317, filed on Nov. 10, 2021, which claims priority to Korean Patent Application No. 10-2020-0150030, filed on Nov. 11, 2020, in the Korean Intellectual Property Office, the disclosures of which are incorporated by reference herein in their entireties.

BACKGROUND

1. Field

The present disclosure relates to a display module for providing an image using an inorganic light emitting device and a display apparatus including the same.

2. Description of Related Art

Display apparatuses are classified into self-emissive displays in which each pixel emits light by itself and light-receiving/emitting displays that require a separate light source.

A liquid crystal display (LCD) is a representative light-receiving/emitting display that includes a backlight unit to supply light from a position behind a display panel, a liquid crystal layer serving as a switch to transmit/block light, a color filter to change the supplied light into a desired color, and the like. Thus, the LCD is structurally complex and has a limitation in decreasing a thickness thereof.

On the other hand, a self-emissive display, in which each pixel includes a light emitting device and emits light by itself, does not require components such as a backlight unit, a liquid crystal layer, and a color filter, and thus a simple structure and a high degree of design freedom may be obtained. The self-emissive display may have a small thickness as well as excellent contrast ratio, high brightness, and wide viewing angle.

Among self-emissive displays, a micro-light emitting diode (LED) display is a flat-panel display that includes a plurality of LEDs each having a size of about 100 μm. The micro-LED display may provide excellent contrast ratio, quick response, and high energy efficiency compared to LCDs that require a backlight.

In addition, the micro-LED, as an inorganic LED, is brighter and has higher light emitting efficiency and longer lifespan as compared to OLEDs that require a separate encapsulation layer for protecting an organic material.

SUMMARY

The present disclosure is directed to a display module and a display apparatus including the display module that are capable of facilitating a circuit test, replacement of a product, and manufacturing processes of the display module and the display apparatus by forming a TFT circuit configured to drive an inorganic LED in a separate chip.

According to an aspect of the disclosure, a display module includes: a first substrate; a plurality of micro-pixel packages provided on an upper surface of the first substrate and including a plurality of pixels arranged in two dimensions; a plurality of micro-pixel controllers provided on the upper surface of the first substrate and configured to control the plurality of micro-pixel packages; and a driver integrated chip (IC) configured to transmit a driving signal to the plurality of micro-pixel controllers, wherein upper ends of the plurality of micro-pixel packages are positioned higher than upper ends of the plurality of micro-pixel controllers with respect to the upper surface of the first substrate.

Each of the plurality of micro-pixel packages may further include: a second substrate; and a plurality of inorganic light emitting diodes (LEDs) provided on the second substrate.

Each of the plurality of pixels may include two or more inorganic LEDs among the plurality of inorganic LEDs, and the plurality of inorganic LEDs of each of the plurality of micro-pixel packages may form two or more pixels among the plurality of pixels.

Heights from the upper surface of the first substrate to upper surfaces of the plurality of inorganic LEDs may be greater than heights from the upper surface of the first substrate to the upper ends of the plurality of micro-pixel controllers.

Each of the plurality of micro-pixel controllers may include: a third substrate; and at least one thin film transistor (TFT) provided on the third substrate, and the at least one TFT may be configured to switch the plurality of inorganic LEDs and supply a driving current to the plurality of inorganic LEDs.

The second substrate may have a thickness that is greater than a thickness of the third substrate.

The at least one TFT may include a low temperature polycrystalline silicon TFT.

The second substrate may include a glass substrate, and the third substrate may include a silicon substrate.

Each of the plurality of micro-pixel controllers may be further configured to control one or more micro-pixel packages adjacent to the micro-pixel controller among the plurality of micro-pixel packages.

Each of the plurality of micro-pixel packages may be configured to be controlled by one or more micro-pixel controllers adjacent to the micro-pixel package among the plurality of micro-pixel controllers.

The display module may further include a black matrix layer provided on upper surfaces of the plurality of micro-pixel controllers.

According to an aspect of the disclosure, a display module includes: a first substrate; a plurality of micro-pixel packages provided on an upper surface of the first substrate and including a plurality of pixels arranged in two dimensions; and a driver integrated chip (IC) configured to transmit a driving signal to the plurality of micro-pixel packages, wherein each of the plurality of micro-pixel packages includes: a second substrate; a plurality of inorganic light emitting diodes (LEDs) provided on the second substrate; and a micro-pixel controller provided on the second substrate and configured to control the plurality of inorganic LEDs, and wherein upper ends of the plurality of inorganic LEDs are positioned higher than an upper end of the micro-pixel controller with respect to the upper surface of the first substrate.

Each of the plurality of micro-pixel packages may further include a buffer layer provided on the micro-pixel controller of the micro-pixel package, and the plurality of inorganic LEDs may be provided on the buffer layer.

According to the display module and the display apparatus including the display module according to embodiments of the present disclosure, a circuit test, replacement of a product, and manufacturing processes of the display module and the display apparatus may be facilitated by forming a TFT circuit configured to drive an inorganic LED in a separate chip.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 is a control block diagram of a display apparatus according to an embodiment;

FIG. 6 is a diagram for conceptually describing a method of driving each pixel in a display module according to an embodiment;

FIGS. 29 and 30 are diagrams illustrating examples of BM processing performed in a plurality of display modules in a display apparatus according to an embodiment;

DETAILED DESCRIPTION

Figure 1:
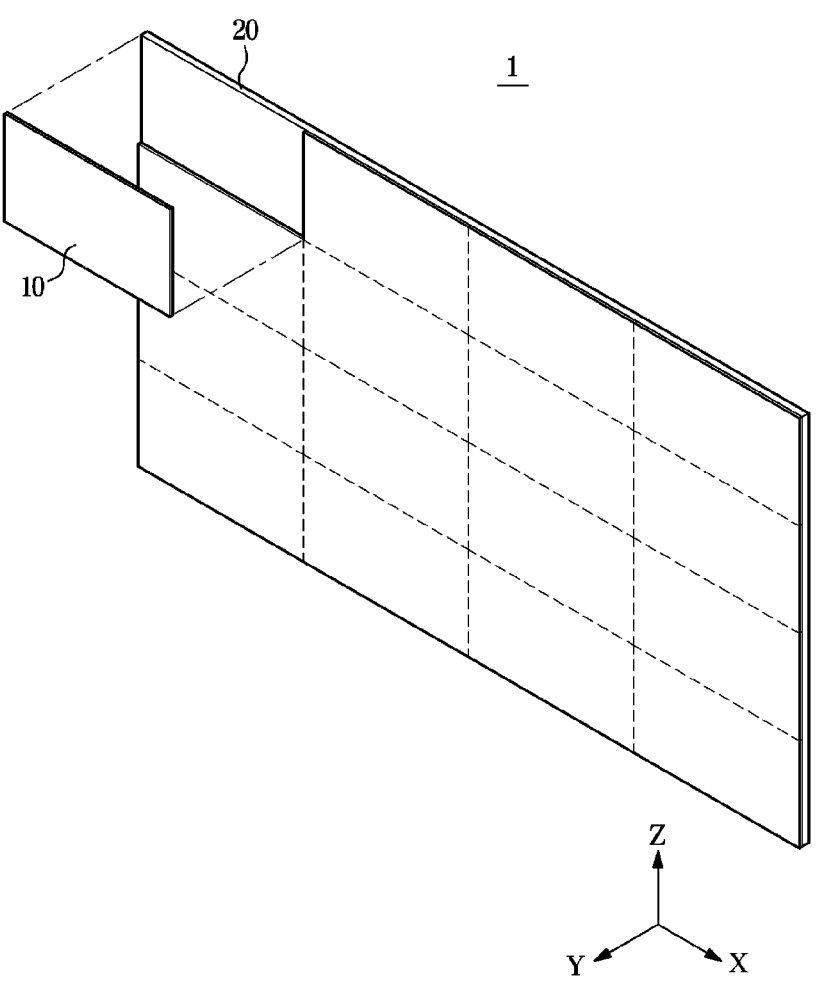
FIG. 1 is a perspective view of display modules and a display apparatus including the same according to an embodiment.

Throughout the specification, like reference numerals refer to like elements. This specification does not describe all elements of the embodiments of the present disclosure and detailed descriptions on what are well known in the art or redundant descriptions on substantially the same configurations may be omitted. The terms 'unit, module, member, and block' used herein may be implemented using a software or hardware component. According to an embodiment, a plurality of 'units, modules, members, and blocks' may also be implemented using an element and one 'unit, module, member, and block' may include a plurality of elements.

Throughout the specification, when an element is referred to as being "connected to" another element, it may be directly or indirectly connected to the other element and the "indirectly connected to" includes connected to the other element via a wireless communication network or electrically connected to the other element by wiring or soldering.

Also, it is to be understood that the terms "include" or "have" are intended to indicate the existence of elements disclosed in the specification, and are not intended to preclude the possibility that one or more other elements may exist or may be added.

Throughout the specification, it will be understood that when one element, is referred to as being "on" another element, it can be directly on the other element, or intervening elements may also be present therebetween.

Throughout the specification, when one element transmits or send a signal or data to another element, it is not intended to preclude the possibility that a third element exists between the elements and the signal or data is transmitted or sent via the third element, unless otherwise stated.

Throughout the specification, terms "first", "second", and the like are used to distinguish one component from another, without indicating alignment order, manufacturing order, or importance of the components.

An expression used in the singular encompasses the expression of the plural, unless otherwise indicated.

As used herein, expressions such as "at least one of," when preceding a list of elements, modify the entire list of elements and do not modify the individual elements of the list. For example, the expressions "at least one of a, b, and c," and "at least one of a, b, or c" should be understood as including only a, only b, only c, both a and b, both a and c, both b and c, or all of a, b, and c.

The reference numerals used in operations are used for descriptive convenience and are not intended to describe the order of operations and the operations may be performed in a different order unless the order of operations are clearly stated.

Hereinafter, a display module, a display apparatus including the display module, and a method of manufacturing the display module according to an embodiment will be described in detail with reference to the accompanying drawings.

Figure 2:
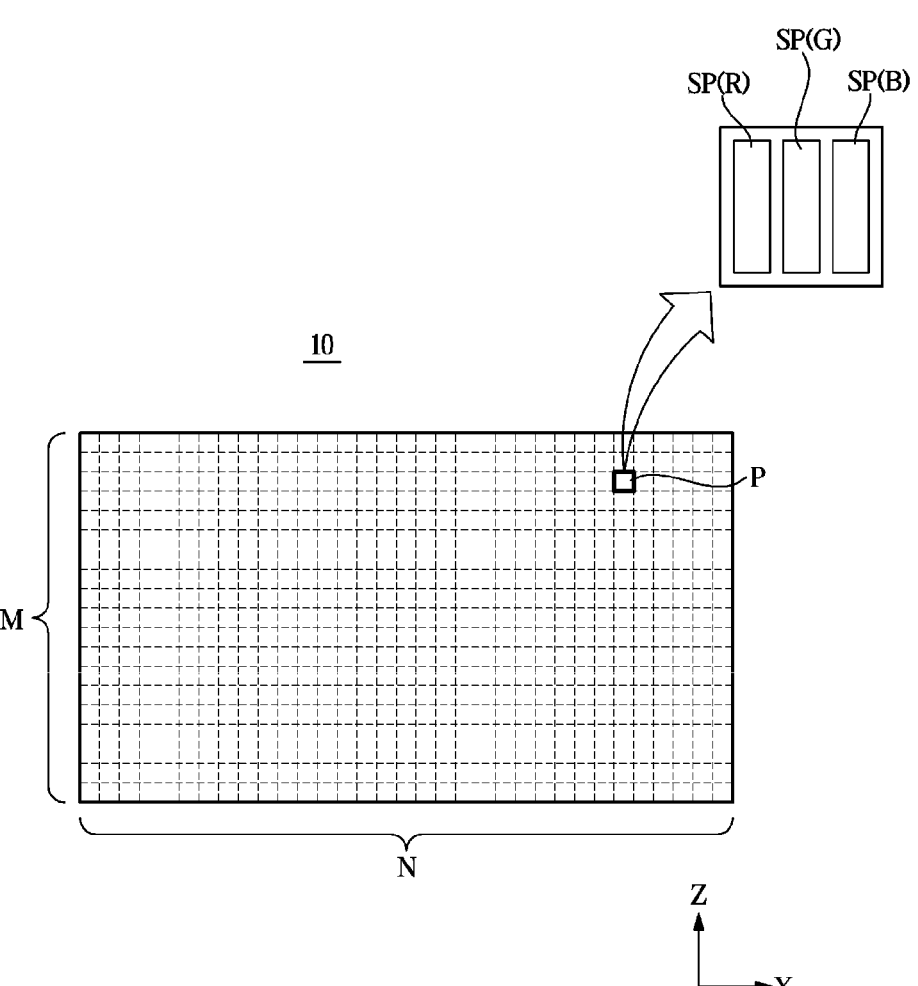
FIG. 2 is a diagram exemplarily illustrating arrangement of pixels constituting a unit module of a display apparatus according to an embodiment.

FIG. 1 is a perspective view of display modules and a display apparatus including the display modules according to an embodiment. FIG. 2 is a diagram showing an arrangement of pixels constituting a unit module of a display apparatus according to an embodiment.

A display apparatus according to an embodiment is a self-emissive display apparatus in which a light emitting device is disposed in each pixel so that the pixel emits light by itself. Thus, unlike liquid crystal display apparatuses, elements such as a backlight unit and a liquid crystal layer are not required, and thus the display apparatus may have a small thickness and a simple structure enabling various design changes.

Also, the display apparatus according to an embodiment may include an inorganic light emitting device such as an inorganic light emitting diode, as a light emitting device, disposed in each pixel. Inorganic light emitting devices provide faster response rates and realize higher brightness with lower power compared to organic light emitting devices such as organic light emitting diodes (OLEDs).

In addition, unlike organic light emitting devices that have poor durability and require an encapsulation process since they are vulnerable to moisture and oxygen, the inorganic light emitting devices do not require the encapsulation process and have excellent durability. Hereinafter, the inorganic light emitting device which will be mentioned in the following embodiments refers to an inorganic light emitting diode.

The inorganic light emitting device used in the display module and the display apparatus according to an embodiment may be a micro-light emitting diode (LED) having a length of a short side of about 100 μm. As such, by using a micro-sized LED, a size of the pixel may be reduced and a high resolution may be provided in the same screen size.

In addition, when an LED chip is manufactured in a micro-scale, a problem of cracking that occurs during bending due to properties of inorganic materials may be overcome. That is, in the case where a micro-LED chip is transferred to a flexible substrate, the LED chip does not break even when the substrate is bent, and thus a flexible display apparatus may be realized.

The display apparatus employing the micro-LED may be applied to various fields by using ultra-small pixel and a small thickness. For example, as shown in FIG. 1, a large-area screen may be implemented by tilting and fixing a plurality of display modules 10 to which a plurality of micro-LEDs are transferred to a housing 20, and the display apparatus 1 having such a large-area screen may be used as a signage, an electronic display, and the like.

A three-dimensional coordinate system of XYZ axes shown in FIG. 1 is designated with respect to the display apparatus 1, and a plane where the screen of the display apparatus 1 is located is an XZ plane, and a direction in which an image is output or a light of the inorganic LED is emitted is +Y direction. Because the coordinate system is designated based on the display apparatus 1, the same coordinate system may be applied to both cases where the display apparatus 1 is used in lying down position and in standing up position.

In general, the display apparatus 1 is used in the standing up position and a user watches an image in front of the display apparatus 1, and thus the +Y direction in which the image is output may be referred to as a forward direction and the opposite direction may be referred to as a backward direction.

In addition, the display apparatus 1 is generally manufactured in the lying down position. Thus, the −Y direction of the display apparatus 1 may also be referred to as a downward direction, and the +Y direction may be referred to as an upward direction. That is, in an embodiment described below, the +Y direction may be referred to as upward direction or forward direction, and the −Y direction may be referred to as downward direction or backward direction.

Four surfaces of a flat-panel display apparatus 1 or a display module 10 except for the upper/front surface and the lower/back surface, are referred to as side surfaces regardless of postures of the display apparatus 1 or the display module 10.

Although FIG. 1 exemplarily illustrates a display apparatus 1 having a large-area screen implemented by a plurality of display modules 10, examples of the display apparatus 1 are not limited thereto. The display apparatus 1 may include a single display module 10 and may be implemented as a TV, a wearable device, a portable device, and a PC monitor.

Referring to FIG. 2, the display module 10 may include pixels arranged in a M×N configuration (where M and N are integers equal to or greater than 2), i.e., a plurality of pixels arranged in two dimensions. FIG. 2 conceptually illustrating arrangement of pixels and the display module 10 may also include a bezel area or a wiring area where an image is not displayed as well as an active area where the pixels are arranged.

According to an embodiment, two-dimensional arrangement of elements may include not only a case in which the elements are arranged on the same plane but also a case in which the elements are arranged on different planes parallel to each other. In addition, when the elements are arranged on the same plane, upper ends of the arranged elements do not necessarily have to be located on the same plane and the upper ends of the arranged elements may also be located on different planes parallel to each other.

The pixel P may include a plurality of sub-pixels emitting light of different colors to provide various colors by combination of the colors. For example, the pixel P may include at least three sub-pixels emitting light of different colors. Specifically, the pixel P may include three sub-pixels SP(R), SP(G), and SP(B) corresponding to red R, green G, and blue B. In this regard, a red sub-pixel SP(R) may emit red light, a green sub-pixel SP(G) may emit green light, and a blue sub-pixel SP(B) may emit blue light.

However, the arrangement of the pixels shown in FIG. 2 is merely an example applicable to the display module 10 and the display apparatus 1 according to an embodiment and the sub-pixels may be arranged along the Z-axial direction and may not be linearly arranged, and the sub-pixels may also be implemented to have different sizes. Size and arrangement of the sub-pixels are not particularly limited as long as each pixel includes a plurality of sub-pixels to realize various colors.

In addition, the pixel P does not necessarily consist of the red sub-pixel SP(R) emitting red light, the green sub-pixel SP(G) emitting green light, and the blue sub-pixel SP(B) emitting blue light, and may further include sub-pixels emitting yellow light or white light. That is, colors and types of light emitted from the respective sub-pixels and numbers of the sub-pixels are not particularly limited.

However, for detailed description of the embodiment provided below, a unit pixel P including a red sub-pixel SP(R), a green sub-pixel SP(G), and a blue sub-pixel SP(B) will be described as an example of the pixel.

As described above, the display module 10 and the display apparatus 1 according to an embodiment are self-emissive display devices in which each pixel is able to emit light by itself. Thus, inorganic LEDs emitting light of different colors may be disposed in each sub-pixel. For example, a red inorganic LED may be disposed in the red sub-pixel SP(R), a green inorganic LED may be disposed in the green sub-pixel SP(G), and a blue inorganic LED may be disposed in the blue sub-pixel SP(B).

Therefore, the pixel P may indicate a cluster including the red inorganic LED, the green inorganic LED, and the blue inorganic LED, and the sub-pixel may indicate each inorganic LED.

Figure 3:
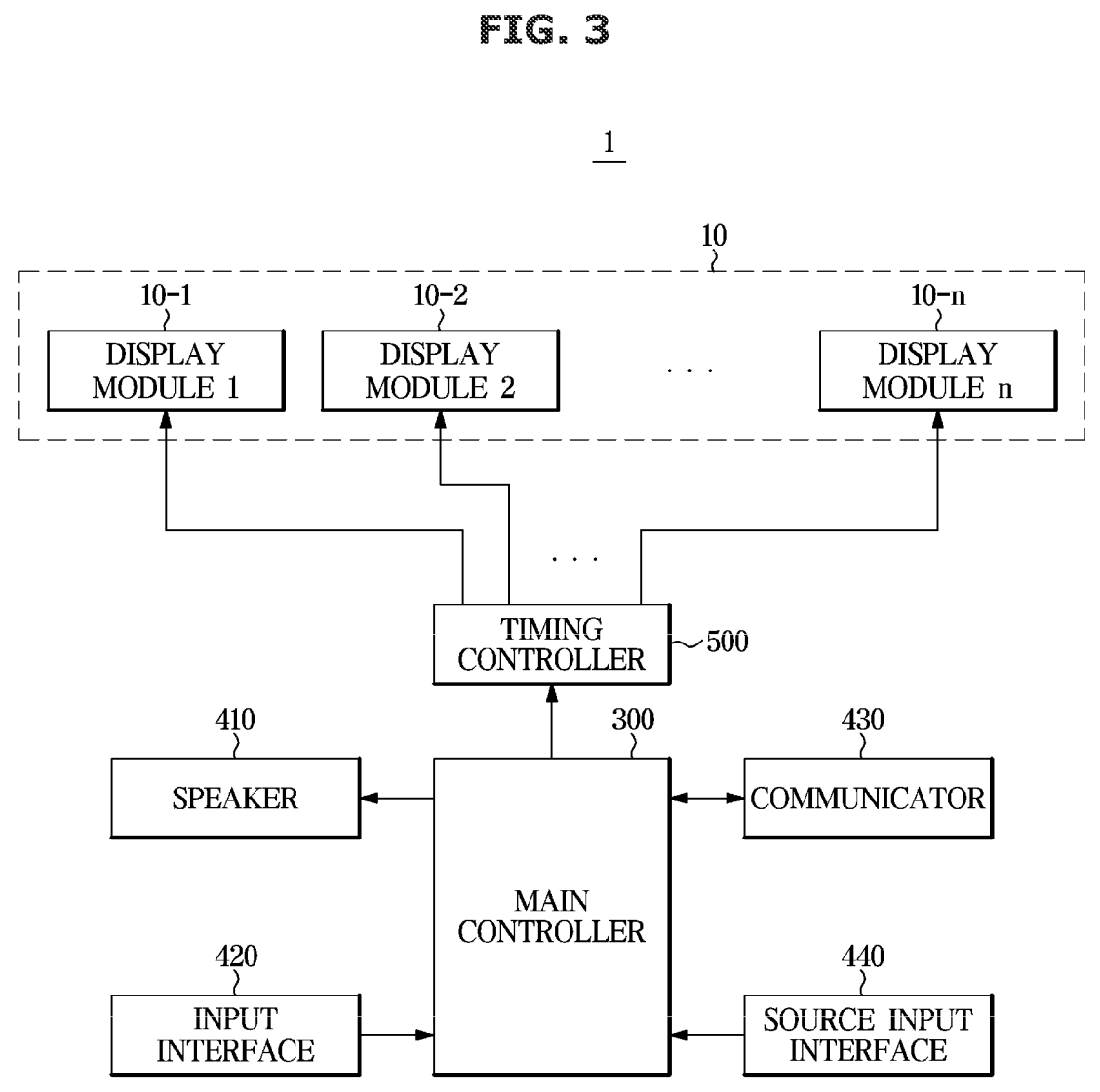

FIG. 3 is a control block diagram of a display apparatus according to an embodiment.

As described above with reference to FIG. 1, the display apparatus 1 may include a plurality of display modules 10-1, 10-2, . . . , and 10-n (where n is an integer equal to or greater than 2), a main controller 300 and a timing controller 500 both configured to control the plurality of display modules 10, a communicator 430 configured to communicate with an external device, a source input interface 440 configured to receive a source image, a speaker 410 configured to output sounds, and an input interface 420 configured to receive a command to control the display apparatus 1 from a user.

The input interface 420 may include a button or touch pad provided at a region of the display apparatus 1. When a display panel 11 (FIG. 4) is implemented with a touch screen, the input interface 420 may include a touch pad provided at a front surface of the display panel 11. In addition, the input interface 420 may also include a remote control.

The input interface 420 may receive various commands to control the display apparatus 1, such as commands for power on/off, volume adjustment, channel change, screen adjustment, and setting changes, from the user.

The speaker 410 may be provided at a region of the housing 20 and another speaker physically separated from the housing 20 may further be provided.

The communicator 430 may communicate with a relay server or another electronic device to transmit/receive necessary data therefrom/thereto. The communicator 430 may employ at least one of various wireless communication protocols such as $3^{rd}$ Generation (3G), $4^{th}$ Generation (4G), Wireless LAN, Wi-Fi, Bluetooth, Zigbee, Wi-Fi Direct (WFD), Ultra-wideband (UWB), Infrared Data Association (IrDA), Bluetooth Low Energy (BLE), Near Field Communication (NFC), and Z-Wave. Also, wired communication protocols such as Peripheral Component Interconnect (PCI), PCI-express, and Universe Serial Bus (USB) may also be used.

The source input interface 440 may receive a source signal input from a set top box, a USB, an antenna, and the like. Therefore, the source input interface 440 may include at least one source input interface selected from a high-definition multimedia interface (HDMI) port, an USB port, and an antenna.

The source signal received by the source input interface 440 may be processed by the main controller 300 and converted into a form that is able to be output via the display panel 11 and the speaker 410.

The main controller 300 and the timing controller 500 may include at least one memory to store programs used to perform operations to be described below and a variety of data related thereto, and at least processor configured to execute the programs stored in the memory.

The main controller 300 may process the source signal input via the source input interface 440 to generate an image signal corresponding to the input source signal.

For example, the main controller 300 may include a source decoder, a scaler, an image enhancer, and a graphic processor. The source decoder may decode a source signal compressed in a format such as MPEG, and the scaler may output image data of a desired resolution by resolution conversion.

The image enhancer may enhance the quality of an image by applying various correction techniques. The graphic processor may classify pixels of image data into RGB data and output the same together with a control signal such as a syncing signal for display timing in the display panel 11. That is, the main controller 300 may output image data corresponding to the source signal and a control signal.

The above-described operations of the main controller 300 are merely examples applicable to the display apparatus 1 and it is possible to further perform another operation or omit some of the above-described operations.

The image data and the control signal output from the main controller 300 may be transmitted to the timing controller 500.

The timing controller 500 may convert the image data received from the main controller 300 into a form that is able to be processed in a driver integrated chip (IC) 200 (FIG. 4) and generate various control signals such as a timing control signal required to display the image data on the display panel 11.

Although the display apparatus 1 may not necessarily include the plurality of display modules 10, a display apparatus 1 including a plurality of display modules 10 will be described as an example in an embodiment described below for detailed description of operations of respective elements.

Figure 4:
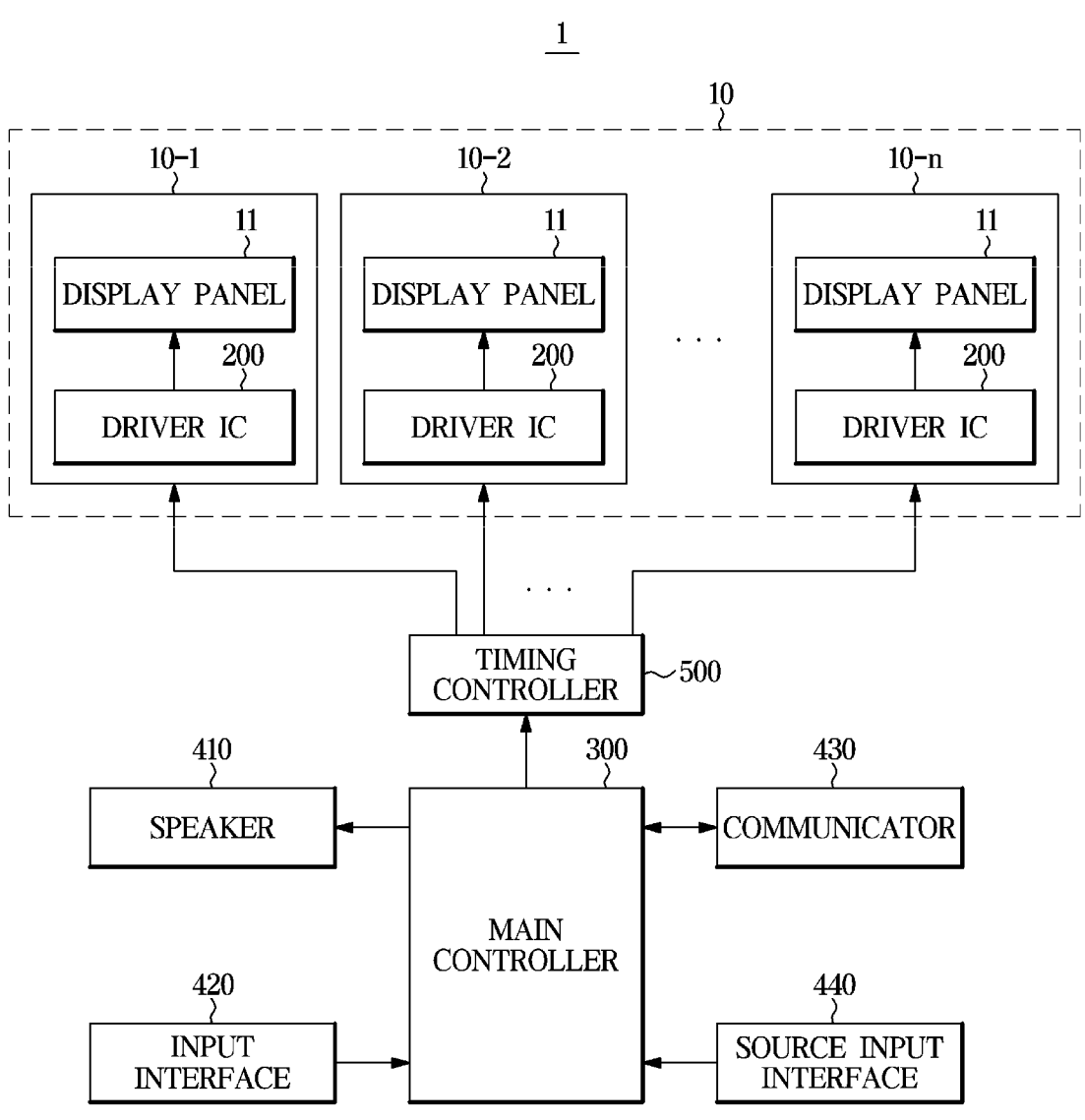
FIG. 4 is a control block diagram illustrating a configuration of a display module included in a display apparatus according to an embodiment.
Figure 5:
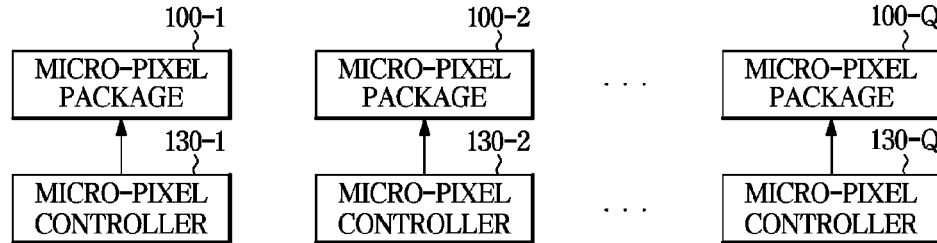
FIG. 5 is a control block diagram illustrating a configuration of a display panel included in a display module according to an embodiment.

FIG. 4 is a control block diagram illustrating a configuration of a display module included in a display apparatus according to an embodiment. FIG. 5 is a control block diagram illustrating a configuration of a display panel included in a display module according to an embodiment.

Referring to FIG. 4, each of the plurality of display modules (10-1, 10-2, . . . , and 10-n) may include a display panel 11 configured to display an image and a driver IC 200 configured to drive the display panel 11.

The driver IC 200 may generate a driving signal based on the image data and the timing control signal received from the timing controller 500 such that the display panel 11 displays an image.

The driving signal generated by the driver IC 200 may include at least one of a gate signal and a data signal, and the generated driving signal is input to the display panel 11.

Referring to FIG. 5, the display panel 11 may include a plurality of micro-pixel packages 100-1, 100-2, . . . , and 100-Q and a plurality of micro-pixel controllers 130-1, 130-2, . . . , and 130-Q. Although three or more micro-pixel packages 100 and micro-pixel controllers 130 are illustrated in FIG. 5, the display module 10 is not limited thereto. The numbers of the micro-pixel packages 100 and the micro-pixel controllers 130 are not particularly limited as long as they are provided in plural in number (where Q is an integer equal to or greater than 2).

In addition, although one micro-pixel package 100 controls one micro-pixel controller 130 in an example illustrated in FIG. 5, two or more micro-pixel controllers 130 may control one micro-pixel package 100 or one micro-pixel controller 130 may control two or more micro-pixel packages 100 as described below.

As described above, the display panel 11 may include a plurality of pixels arranged in two dimensions and each pixel may include a plurality of sub-pixels to realize various colors.

Also, as described above, the display apparatus 1 may be a self-emissive display apparatus in which each of the pixels emits light by itself. Thus, an inorganic LED 120 may be disposed in each sub-pixel. That is, each of the plurality of pixels may include two or more inorganic LEDs 120.

Although each of the inorganic LEDs 120 may be driven in an active matrix (AM) method or a passive matrix (PM) method, an inorganic LED 120 driven in the AM method will be described as an example in an embodiment described below for detailed description thereof.

In the display module 10, each of the inorganic LEDs 120 may be individually controlled by a micro-pixel controller 130, and the micro-pixel controller 130 may operate based on a driving signal output from the driver IC 200.

Figure 6:
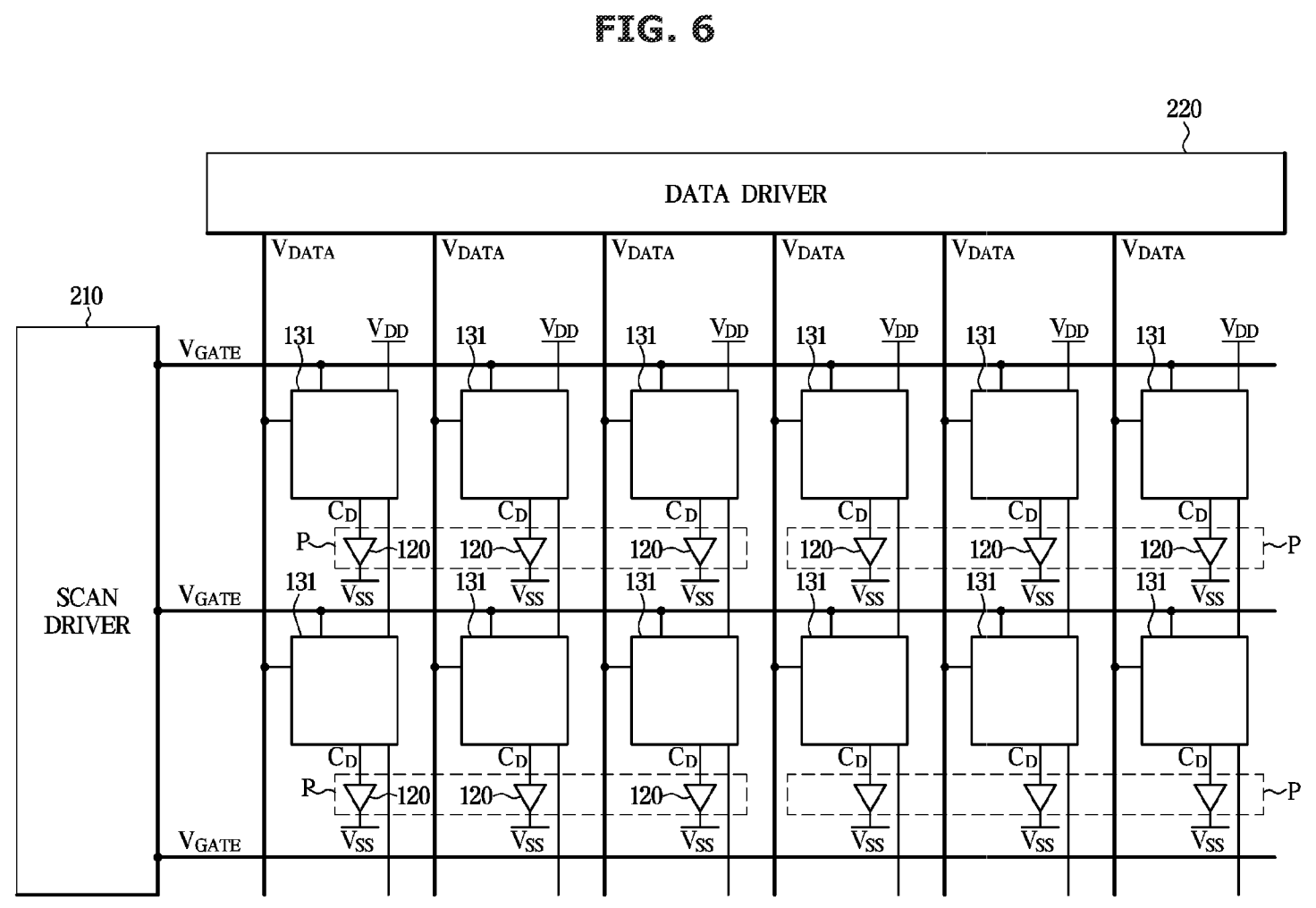

FIG. 6 is a diagram for conceptually describing a method of driving each pixel in a display module according to an embodiment.

Referring to FIG. 6, the driver IC 200 may include a scan driver 210 and a data driver 220. The scan driver 210 may output a gate signal for turning on/off sub-pixels, and the data driver 220 may output a data signal for generating an image. However, in accordance with various design changes, some operations of the driver IC 200 may be performed by the micro-pixel controller 130. For example, when the operation of the scan driver 210 is performed by the micro-pixel controller 130, the driver IC 200 may not include the scan driver 210. A driver IC 200 including both the scan driver 210 and the data driver 220 will be described as an example in an embodiment described below for detailed description thereof.

The scan driver 210 may generate a gate signal based on a timing control signal received from the timing controller 500, and the data driver 220 may generate a data signal based on image data received from the timing controller 500.

The micro-pixel controller 130 may include a pixel circuit 131 for individually controlling each inorganic LED 120, and the data signal output from the scan driver 210 and the data signal output from the data driver 220 may be input to the pixel circuit 131.

For example, when a gate voltage $V_{GATE}$, a data voltage $V_{DATA}$, and a supply voltage $V_{DD}$ are input to the pixel circuit 131, the pixel circuit 131 may output a driving current $C_D$ for driving the inorganic LED 120.

The driving current $C_D$ output from the pixel circuit 131 may be input to the inorganic LED 120, and the inorganic LED 120 may emit light by the input driving current $C_D$ to provide an image.

FIG. 6 conceptually illustrates input and output of signals for the pixel circuit 131, and thus the arrangement of the elements and the wiring structure thereof may be different from arrangement of the elements and a wiring structure in actually implemented display modules 10.

Figure 7:
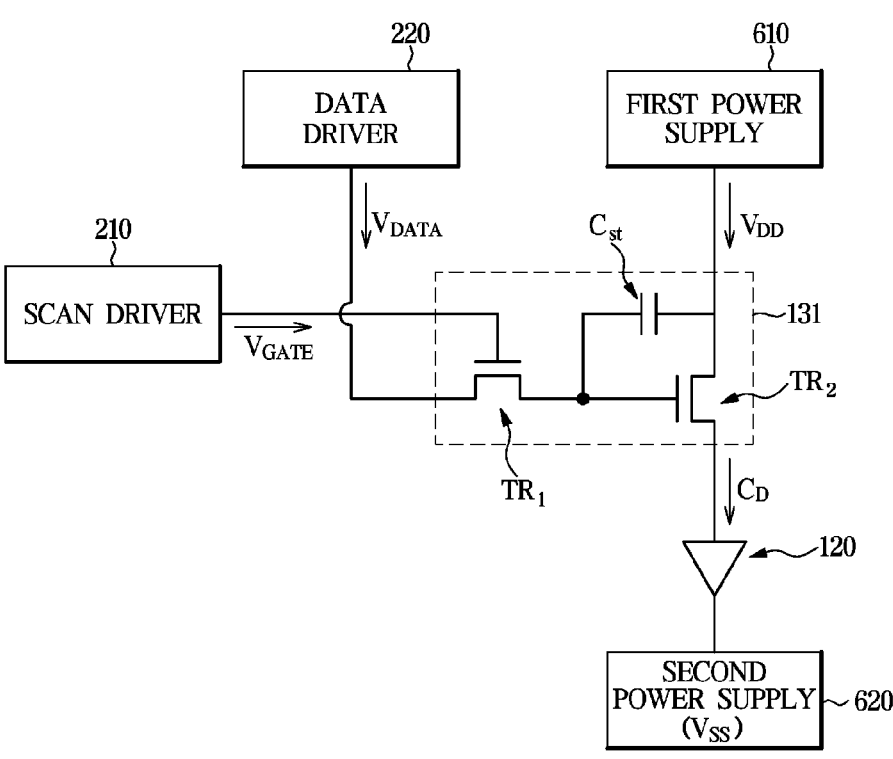
FIG. 7 is a circuit diagram schematically illustrating a pixel circuit configured to control a single sub-pixel in a display module according to an embodiment.

FIG. 7 is a circuit diagram schematically illustrating a pixel circuit configured to control a single sub-pixel in a display module according to an embodiment.

Referring to the example of FIG. 7, the pixel circuit 131 may include thin film transistors (TFTs) $TR_1$ and $TR_2$ and a capacitor Cst configured to switch or drive the inorganic LED 120. As described above, the inorganic LED 120 may be a micro-LED.

For example, the TFTs $TR_1$ and $TR_2$ may include a switching TFT $TR_1$ and a driving TFT $TR_2$, and the switching TFT $TR_1$ and a driving TFT $TR_2$ may be implemented using a PMOS type transistor. However, embodiments of the display module 10 and the display apparatus 1 are not limited thereto and the switching TFT $TR_1$ and the driving TFT $TR_2$ may also be implemented using an NMOS type transistor.

A gate electrode of the switching TFT $TR_1$ may be connected to the scan driver 210, a source electrode may be connected to the data driver 220, and a drain electrode may be connected to one end of the capacitor Cst and a gate electrode of the driving TFT $TR_2$. The other end of the capacitor Cst may be connected to a first power supply 610.

In addition, a source electrode of the driving TFT $TR_2$ may be connected to the first power supply 610 that supplies the supply voltage $V_{DD}$, and the drain electrode may be connected to an anode of the inorganic LED 120. A cathode of the inorganic LED 120 may be connected to a second power supply 620 that supplies a reference voltage $V_{SS}$. The reference voltage $V_{SS}$ may be a voltage of a lower level than the supply voltage $V_{DD}$, and a ground voltage may be used therefor to provide a ground.

The pixel circuit 131 having the above-described structure may operate as follows. First, when the switching TFT $TR_1$ is turned on by a gate voltage $V_{GATE}$ received from the scan driver 210, a data voltage $V_{DATA}$ output from the data driver 220 is transmitted to one end of the capacitor Cst and the gate electrode of the driving TFT $TR_2$.

A voltage corresponding to a gate-source voltage $V_{GS}$ of the driving TFT $TR_2$ may be maintained for a predetermined time by the capacitor Cst. The driving TFT $TR_2$ may apply a driving current $C_D$ corresponding to the gate-source voltage $V_{GS}$ to the anode of the inorganic LED 120 to allow the inorganic LED 120 to emit light.

However, the above-described structure of the pixel circuit 131 is merely an example applicable to the display module 10 according to an embodiment and various circuit structures for switching and driving the plurality of inorganic LEDs 120 may also be applied thereto in addition to the above-described examples.

Also, methods of controlling brightness of the inorganic LED 120 are not particularly limited. The brightness of the inorganic LED 120 may be controlled by one of various methods such as a Pulse Amplitude Modulation (PAM)

method, a Pulse Width Modulation (PWM) method, and a hybrid method in which the PAM method and the PWM method are combined.

According to an embodiment of the display module 10, one micro-pixel controller 130 may control a plurality of pixels. Here, controlling of the pixels may refer to controlling of a plurality of inorganic LEDs 120 constituting the pixels.

Figure 8:
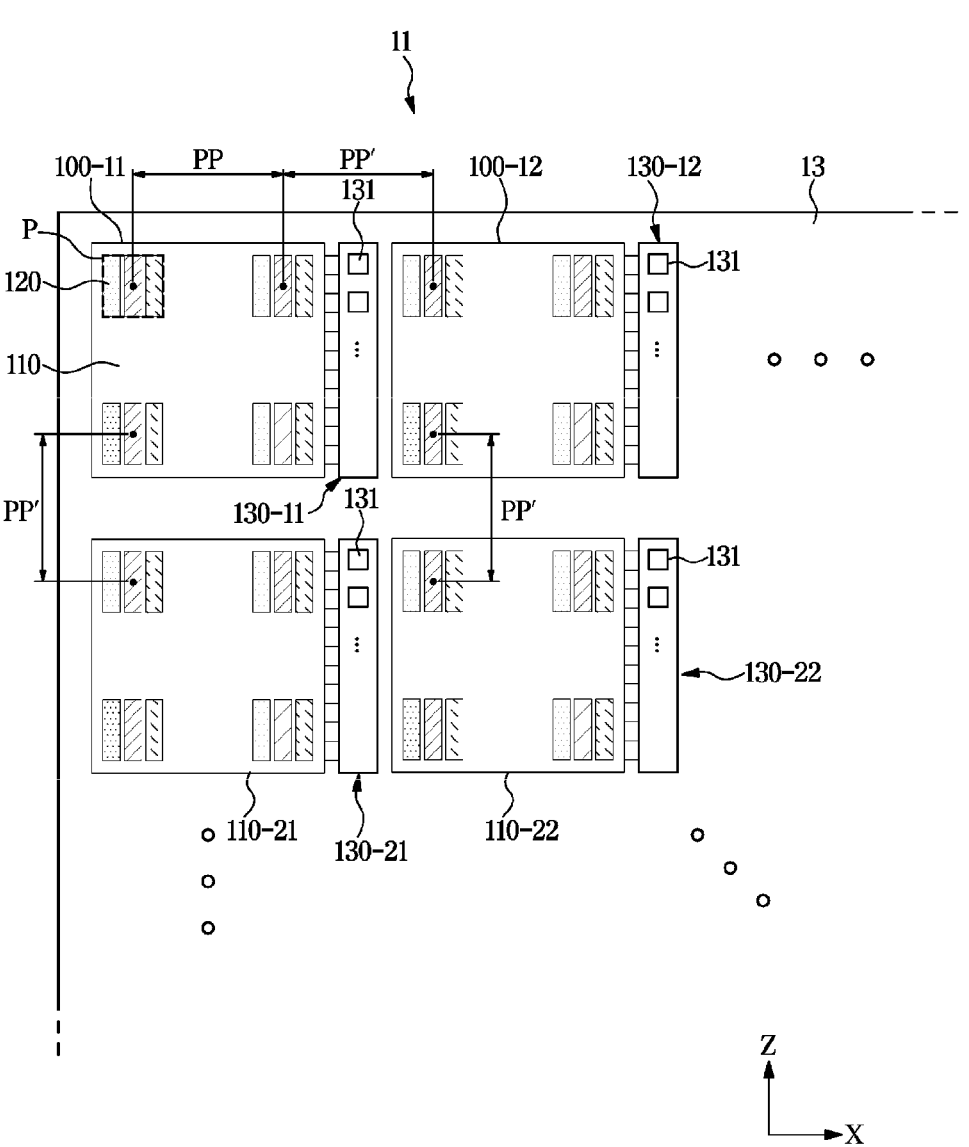
FIGS. 8 to 10 are diagrams illustrating various examples of arrangement of micro-pixel packages and micro-pixel controllers in a display module according to an embodiment.
Figure 9:
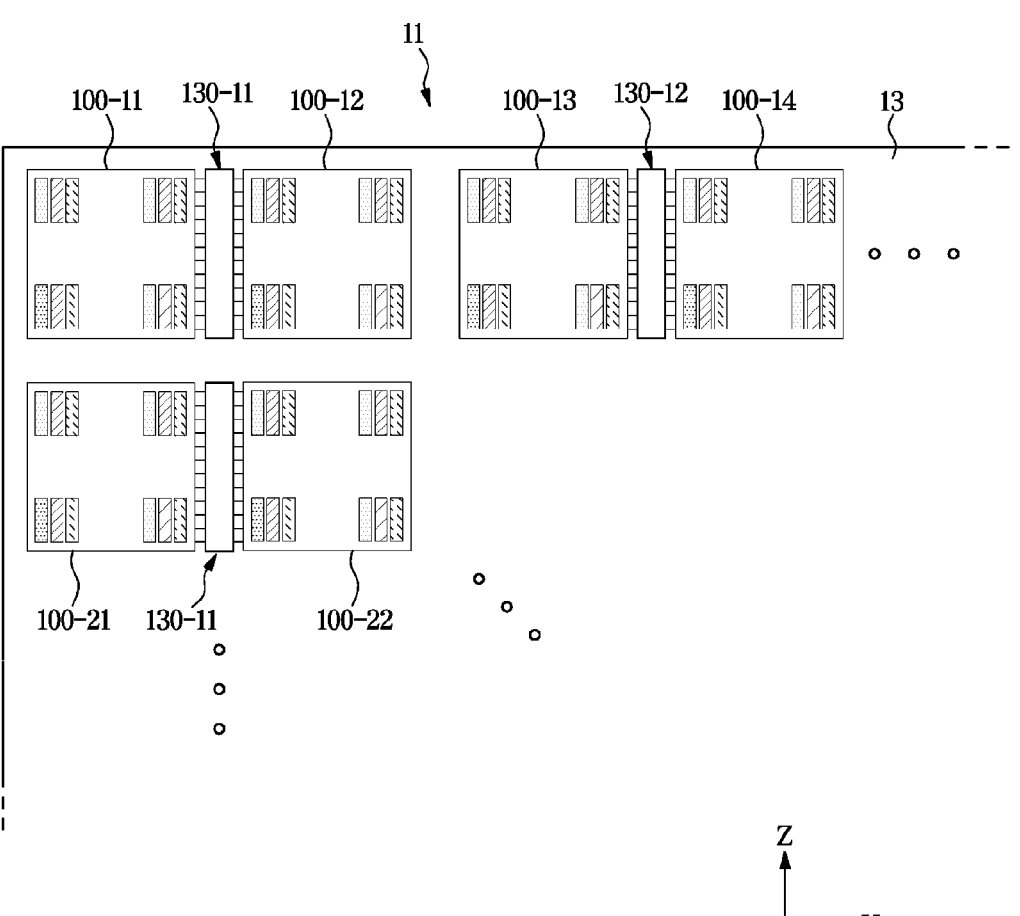
Figure 10:
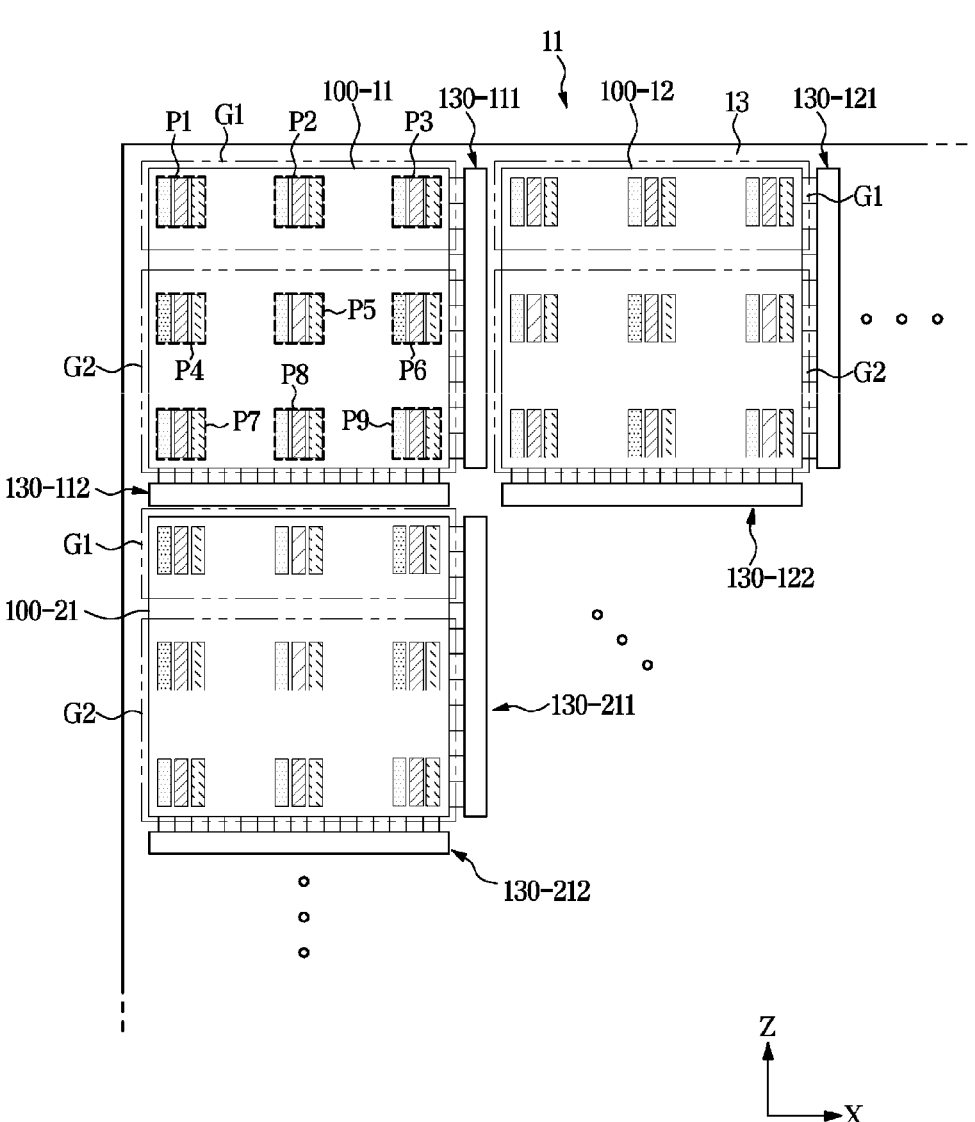

FIGS. 8 through 10 are diagrams illustrating various examples of arrangements of micro-pixel packages and micro-pixel controllers in a display module according to an embodiment.

A micro-pixel package 100 may include a plurality of pixels, and a micro-pixel controller 130 may be disposed adjacent to the micro-pixel package 100 to control the micro-pixel package 100.

Referring to FIG. 8, the display panel 11 may include a module substrate 13, a plurality of micro-pixel packages 100-11, 100-12, 100-21, and 100-22 disposed on an upper surface of the module substrate 13, and a plurality of micro-pixel controllers 130-11, 130-12, 130-21, and 130-22 disposed on the upper surface of the module substrate 13 and configured to control the plurality of micro-pixel packages 100.

The micro-pixel package 100 may include a package substrate 110 and a plurality of pixels disposed on an upper surface of the package substrate 110. In FIG. 8, a case in which four pixels are provided in a single micro-pixel package 100 is illustrated as an example. When assuming that a unit pixel includes three sub-pixels, twelve inorganic LEDs 120 may be provided in a single micro-pixel package 100 in this embodiment.

The micro-pixel controller 130 may include a control substrate 132 and a pixel circuit 131 provided on the control substrate 132. In an embodiment described below, the module substrate 13, the package substrate 110, and the control substrate 132 will be referred to as a first substrate 13, a second substrate 110, and a third substrate 132, respectively, to distinguish one from another.

According to the example of FIG. 8, the micro-pixel controller 130 may be disposed on one side of the micro-pixel package 100 along the X-axial direction, and the micro-pixel controller 130 may control the micro-pixel package 100 disposed on the left side (−X direction) or on the right side (+X direction) along the X-axial direction. In this example, −X direction is defined as left direction, +X direction is defined as right direction, +Z direction is defined as upward direction, and −Z direction is defined as downward direction. In this case, all of the left, right, upward, and downward directions are defined based on the micro-pixel package 100 or the micro-pixel controller 130.

In this example, a single micro-pixel controller 130 may control a single micro-pixel package 100. Therefore, the micro-pixel controller 130 may include 12 pixel circuits 131 to control the twelve inorganic LEDs 120, respectively. Or, the embodiment may also be implemented such that one pixel circuit 131 controls two or more inorganic LEDs 120.

A first micro-pixel controller 130-11 may control a first micro-pixel package 110-11 closely disposed on the left side thereof, a second micro-pixel controller 130-12 may control a second micro-pixel package 110-12 closely disposed on the left side thereof, a third micro-pixel controller 130-21 may control a third micro-pixel package 110-21 closely disposed on the left side thereof, and a fourth micro-pixel controller 130-22 may control a fourth micro-pixel package 110-22 closely disposed on left side thereof. Although not shown in the drawings, the same descriptions may also be applied to the other micro-pixel controllers and micro-pixel packages.

When the plurality of pixels are arranged on the second substrate 110, distances between adjacent pixels located on the top, bottom, and left and right sides may be maintained the same. The distance between the pixels may be referred to as pixel pitch PP and the pixel pitch PP is defined as a distance from the center of one pixel to the center of another pixel adjacent thereto. However, the embodiment of the display module 10 is not limited thereto, and the pixel pitch PP may also be defined differently.

The micro-pixel packages 100 may be arranged in consideration of the overall arrangement of pixels and pixel pitches of the display module 10. For example, when the display module 10 includes pixels arranged in an M×N matrix form and pixels are arranged in a single micro-pixel package 100 in accordance with the m×n arrangement, M/m micro-pixel packages 100 may be arranged in a column direction, i.e., the Z-axial direction, and N/n micro-pixel packages 100 may be arranged in a row direction, i.e., the X-axial direction.

As described above, pixel pitches PP between one pixel and adjacent pixels located on the top, bottom, and left and right sides thereof one pixel may be maintained in the micro-pixel package 100. The pixel pitches PP may be maintained the same even in the unit of display module 10. The expression 'some values are the same' may include not only a case in which the values are completely identical to each other, but also a case in which the values are identical to each other within a predetermined error range.

Evan when two adjacent pixels P are disposed in different micro-pixel packages 100, arrangement and distance between the two pixels P may be determined such that a pixel pitch PP' between the two pixels are maintained the same as the pixel pitch PP in the single micro-pixel package 100.

The micro-pixel controller 130 may be disposed in a space between adjacent micro-pixel packages 100. For example, when the micro-pixel controller 130 has a rectangular parallelepiped shape, a shorter side of an upper surface or a lower surface of the micro-pixel controller 130 may be set to be smaller than a minimum distance between two adjacent micro-pixel packages 100, and the shorter sides of the micro-pixel controller 130 may be disposed to be parallel to a line perpendicular to two adjacent micro-pixel packages 100 indicating the minimum distance therebetween.

Although the micro-pixel controller 130 may be shown as disposed on the left or right side of the micro-pixel package 100 controlled, the micro-pixel controller 130 may also be disposed on the top or bottom side (in the Z-axial direction) of the micro-pixel package 100 controlled thereby.

A single micro-pixel controller 130 may also control two or more micro-pixel packages 100. According to the embodiment FIG. 9, the micro-pixel controller 130 may control two micro-pixel packages 100 closely disposed on the left and right sides. That is, the two micro-pixel packages 100 disposed adjacent to each other may be controlled by one micro-pixel controller 130 disposed therebetween. In this case, the micro-pixel controller 130 may include pixel circuits 131 configured to control 24 inorganic LEDs 120.

As shown in FIG. 9, a first micro-pixel controller 130-11 may control both a first micro-pixel package 100-11 closely disposed on the left side and a second micro-pixel package 100-12 closely disposed on the right side.

Also, a second micro-pixel controller 130-12 may control a third micro-pixel package 100-13 closely disposed on the left side and a fourth micro-pixel package 100-14 closely disposed on the right side.

A third micro-pixel controller 130-21 may control a fifth micro-pixel package 100-21 closely disposed on the left side and a sixth micro-pixel package 100-22 closely disposed on the right side.

Although a case in which the micro-pixel controller 130 is disposed on the left side or right side of the micro-pixel package 100 is exemplarily described in this example, the micro-pixel controller 130 may also be disposed on the top side or bottom side of the micro-pixel package 110. In this case, two micro-pixel packages 100 disposed to be adjacent to each other in the vertical direction may be controlled by one micro-pixel controller 130 disposed therebetween.

A single micro-pixel package 100 may also be controlled by two or more micro-pixel controllers 130. According to the embodiment of FIG. 10, a first micro-pixel package 100-11 may be controlled by both a micro-pixel controller 130-111 closely disposed on the right side thereof and a micro-pixel controller 130-112 closely disposed on the bottom side thereof.

A second micro-pixel package 100-12 may be controlled by both a micro-pixel controller 130-121 closely disposed on the right side thereof and a micro-pixel controller 130-122 closely disposed on the bottom side thereof.

A third micro-pixel package 100-21 may be controlled by both a micro-pixel controller 130-211 closely disposed on the right side thereof and a micro-pixel controller 130-212 closely disposed on the bottom side thereof.

In this case, the pixels provided in the micro-pixel package 100 may be classified into two groups G1 and G2, and pixels of a first group G1 may be controlled by the micro-pixel controller 130 closely disposed on the right side thereof and pixels of a second group G may be controlled by the micro-pixel controller 130 closely disposed on the bottom side thereof.

In the case where one micro-pixel controller 130 controls two or more micro-pixel packages 100 or in the case where one micro-pixel package 100 is controlled by two or more micro-pixel controllers 130, the pixel pitch PP' between two pixels disposed in different micro-pixel packages 100 may also be maintained the same as the pixel pitch PP between pixels disposed in the same micro-pixel package 100 and the micro-pixel controller 130 may also be disposed between two adjacent micro-pixel packages 100 as described above.

Figure 11:
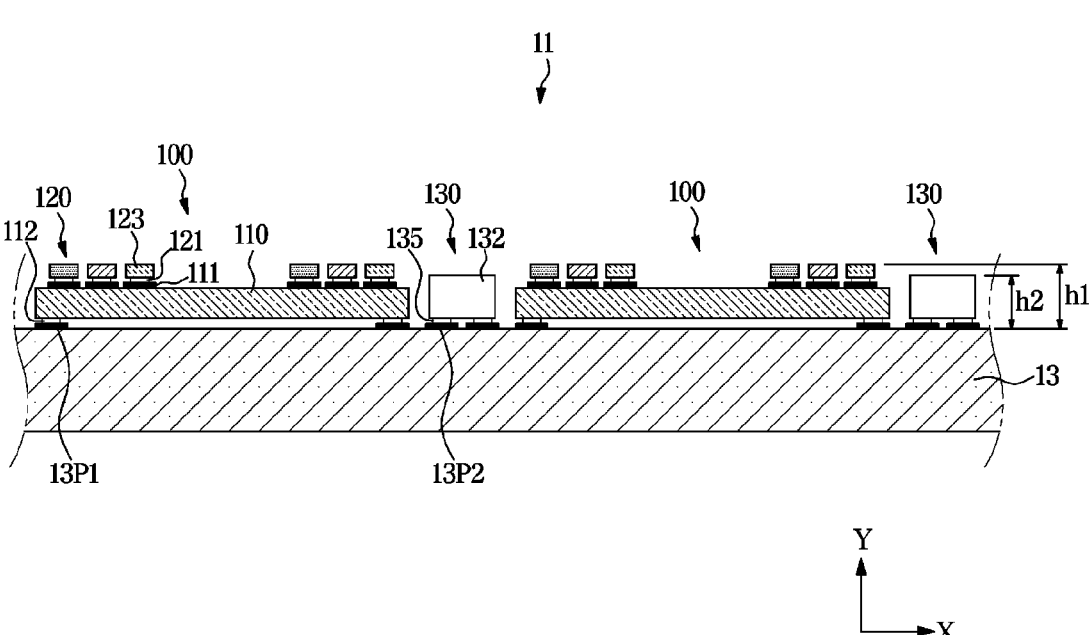
FIG. 11 is a side cross-sectional view of a display panel on which micro-pixel packages and micro-pixel controllers are disposed in a display module according to an embodiment.

FIG. 11 is a side cross-sectional view of a display panel on which micro-pixel packages and micro-pixel controllers are disposed in a display module according to an embodiment. The arrangement of the micro-pixel packages 100 and the micro-pixel controllers 130 illustrated in FIG. 11 corresponds to that shown in FIG. 8.

Referring to FIG. 11, the plurality of micro-pixel packages 100 and the plurality of micro-pixel controllers 130 may be disposed on the upper surface of the first substrate 13. The plurality of inorganic LEDs 120 may be disposed on the second substrate 110 of the micro-pixel package 100, and the pixel circuit 131 configured to control the plurality of inorganic LEDs 120 may be disposed on the third substrate 132 of the micro-pixel controller 130.

The inorganic LED 120 may have a flip chip structure in which a pair of electrodes 121 and 122 are disposed on the opposite surface of a light emitting surface of the inorganic LED 120.

Figure 13:
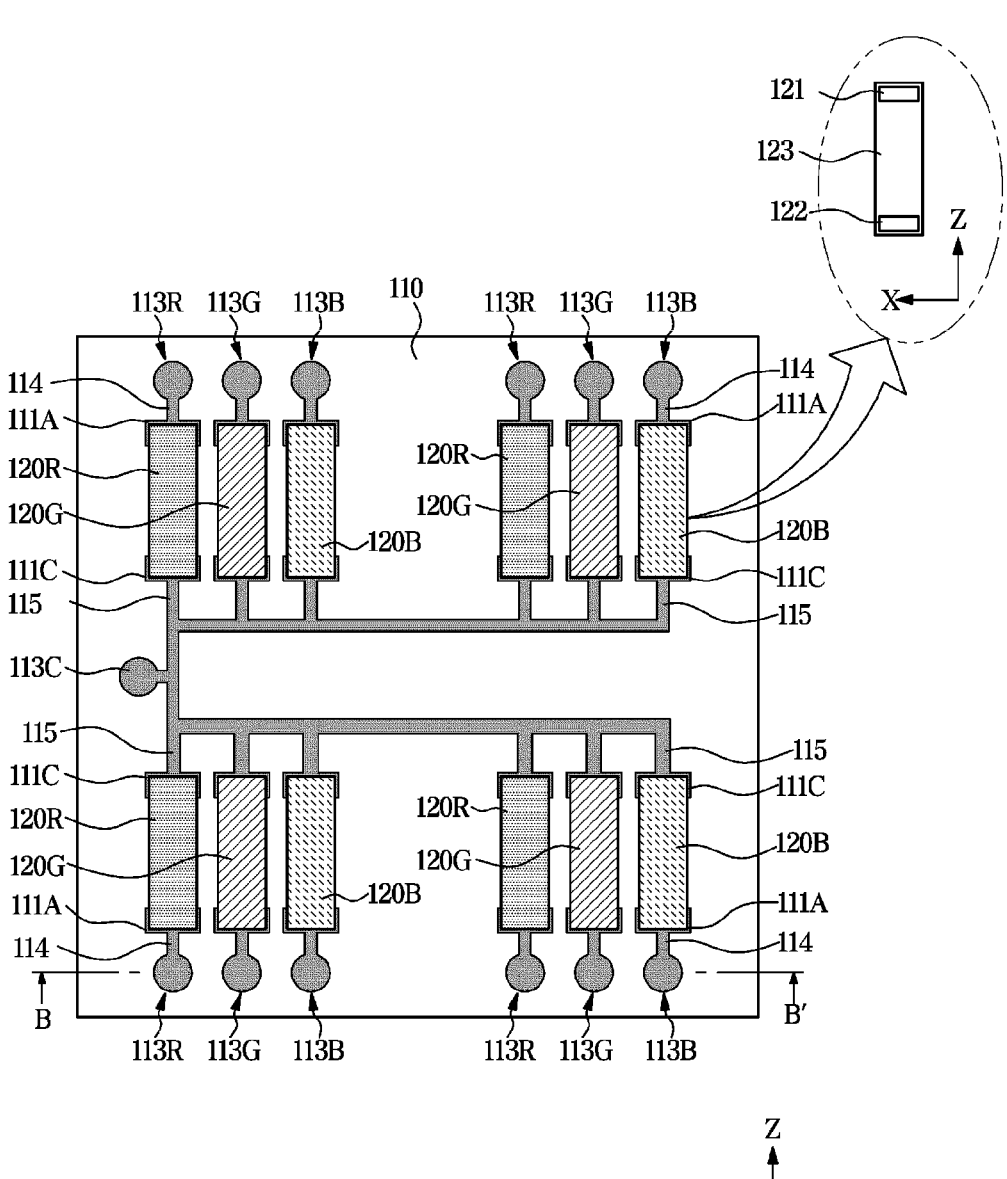
FIG. 13 is a diagram illustrating an upper surface of a micro-pixel package in which a VIA hole wiring is formed in a display module according to an embodiment.

The pair of electrodes 121 and 122 may include an anode 121 and a cathode 122. For example, the anode 121 and the cathode 122 may be provided at both ends of the inorganic LED 120 in a lengthwise direction (vertical direction), respectively (FIG. 13). FIG. 11 is a view of a shorter side of the inorganic LED 120, and thus only the anode electrode 121 is illustrated.

The light emitting surface of the inorganic LED 120 is disposed to face upward (+Y direction), and the electrodes 121 and 122 disposed on the surface opposite to the light emitting surface may be electrically connected to an upper electrode pad 111 provided on the upper surface of the second substrate 110.

On the upper surface of the first substrate 13, an upper connection pad 13P1 for connection with the micro-pixel package 100 and an upper connection pad 13P2 for connection with the micro-pixel controller 130.

A lower electrode pad 112 provided on the lower surface of the second substrate 110 may be electrically connected to the upper connection pad 13P1 provided on the upper surface of the first substrate 13, and a connection pin 135 provided on the lower surface of the third substrate 132 may be electrically connected to the upper connection pad 13P2 provided on the upper surface of the first substrate 13.

The pixel circuits 131 and other components included in the micro-pixel controller 130 may be disposed on the upper surface of the third substrate 132 or on the lower surface of the third substrate 132. When the components are disposed on the upper surface of the third substrate 132, a side wiring or vertical interconnect access (VIA) hole wiring may be used for connection between the components and the connection pin 135.

The expression 'two components are electrically connected' may include not only a case in which electrically conductive materials are directly soldered, but also a case in which they are connected using separate wiring or a conductive adhesive. Methods for connecting the components are not particularly limited as long as a current flows between the connected components.

For example, when two components are soldered, Au—In bonding, Au—Sn bonding, Cu pillar/SnAg bump bonding, Ni pillar/SnAg bump bonding, SnAgCu, SnBi, and SnAg solder ball bonding, and the like may be used.

In addition, when the conductive adhesive is used, a conductive adhesive such as an anisotropic conductive film (ACF) and an anisotropic conductive paste (ACP) is disposed between two components and a pressure is applied thereto so that a current flows in a direction to which the pressure is applied.

Each of the first substrate 13, the second substrate 110, and the third substrate 132 may be implemented using a silicon substrate, a glass substrate, a plastic substrate, a printed circuit board (PCB), a flexible printed circuit board (FPCB), and a cavity substrate which are formed of various materials.

Because the inorganic LED 120 or the TFT circuit are not directly mounted on the first substrate 13, the type of the first substrate 13 may be selected in consideration of ease, efficiency, costs, and the like of manufacturing process.

In addition, because the pixel circuits 131 for switching and driving the plurality of inorganic LEDs 120 are disposed on the separate micro-pixel controller 130, circuit elements such as TFTs, other than electrode pads or wiring, are not necessarily disposed on the second substrate 110 on which the inorganic LEDs 120 are disposed. Thus, the second substrate 110 may be implemented using a glass substrate having excellent durability against heat generated by the inorganic LEDs 120. Although the second substrate 110 is implemented using a glass substrate, performance of the TFTs is not affected thereby.

Because the micro-pixel controller 130 provided with the pixel circuits 131 does not include a heat source such as the inorganic LED 120, the type of the third substrate 132 may be selected without limitation on heat resistance of a material used therefor.

The TFT formed on the third substrate 132 may be a low temperature polycrystalline silicon (LTPS) TFT or an oxide TFT. The TFT may also be an a-Si TFT or a single-crystal TFT. However, an LTPS TFT will be described as an example of the TFT in the following description.

As described above, the third substrate 132 may be implemented using a silicon substrate. Because electron mobility is less limited in the silicon substrate than that in the glass substrate, performance of the LTPS TFT may be improved by implementing the third substrate 132 using a silicon substrate.

According to an embodiment of the display module 10, a circuit test for the micro-pixel controllers 130 may be performed individually, and only micro-pixel controllers 130 having passed the circuit test may be mounted on the display module 10. Therefore, the circuit test and replacement of a defective product may be performed more easily than a case in which a TFT circuit is directly mounted on a module substrate.

In addition, by individually testing the quality of the inorganic LEDs 120 for each micro-pixel package 100 and mounting only micro-pixel packages 100 with good quality on the display module 10, defective products may be easily replaced.

Because upper ends of the micro-pixel packages 100, which are disposed on the same surface as the micro-pixel controllers 130, are located higher than upper ends of the micro-pixel controllers 130, loss of viewing angle caused by the micro-pixel controllers 130 may be prevented.

Specifically, a height h1 from the upper surface of the first substrate 13 to the upper surface of the inorganic LED 120, i.e., to the light emitting surface, may be greater than a height h2 from the upper surface of the first substrate 13 to the upper end of the micro-pixel controller 130.

The upper end of the micro-pixel controller 130 may be defined differently according to arrangement of components provided on the micro-pixel controller 130. For example, when the components such as the pixel circuit 131 are disposed on the lower surface of the third substrate 132, the upper end of the micro-pixel controller 130 may be defined as the upper surface of the third substrate 132.

On the contrary, when the components such as the pixel circuits 131 are disposed on the upper surface of the third substrate 132, the upper end of the micro-pixel controller 130 may be defined as an upper end of a component disposed on the third substrate 132, e.g., an upper end of a component protruding to have the greatest height, among the arranged components.

Adjustment of the heights of the upper ends of the micro-pixel packages 100 and the upper ends of the micro-pixel controllers 130 may be performed by various methods. For example, a thickness of the second substrate 110 may be adjusted to be greater than a thickness of the third substrate 132 so that the light emitting surface of the inorganic LED 120 disposed on the upper surface of the second substrate 110 becomes higher than the upper surface of the third substrate 132 or the upper ends of the components disposed on the upper surface of the third substrate 132.

Alternatively, heights of the electrode pads 111 and 112 or the connection pad 13P1 disposed on or connected to the micro-pixel package 100 may be greater than heights of the connection pin 135 or the connection pad 13P2 disposed on or connected to the micro-pixel controller 130.

The micro-pixel package 100 and the micro-pixel controller 130 respectively disposed on separate chips may be electrically connected to each other through an upper wiring formed on the upper surface of the first substrate 13. The inorganic LEDs 120 disposed on the upper surface of the second substrate 110 may be electrically connected to the upper wiring formed on the upper surface of the first substrate 13 through the VIA hole wiring or side wiring formed on the second substrate 110. Hereinafter, this will be described in more detail with reference to FIGS. 12 to 16.

Figure 12:
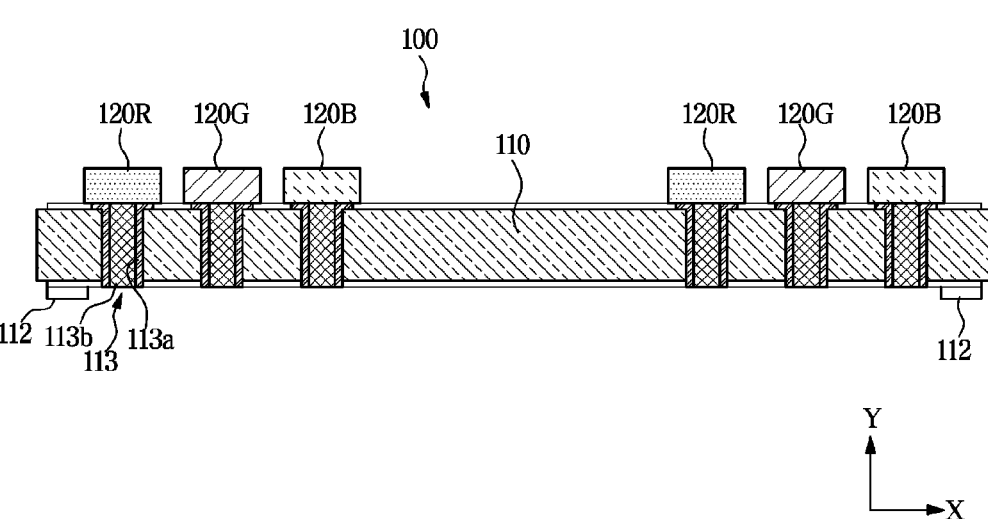
FIG. 12 is a side cross-sectional view of a micro-pixel package in which a VIA hole wiring is formed in a display module according to an embodiment.
Figure 14:
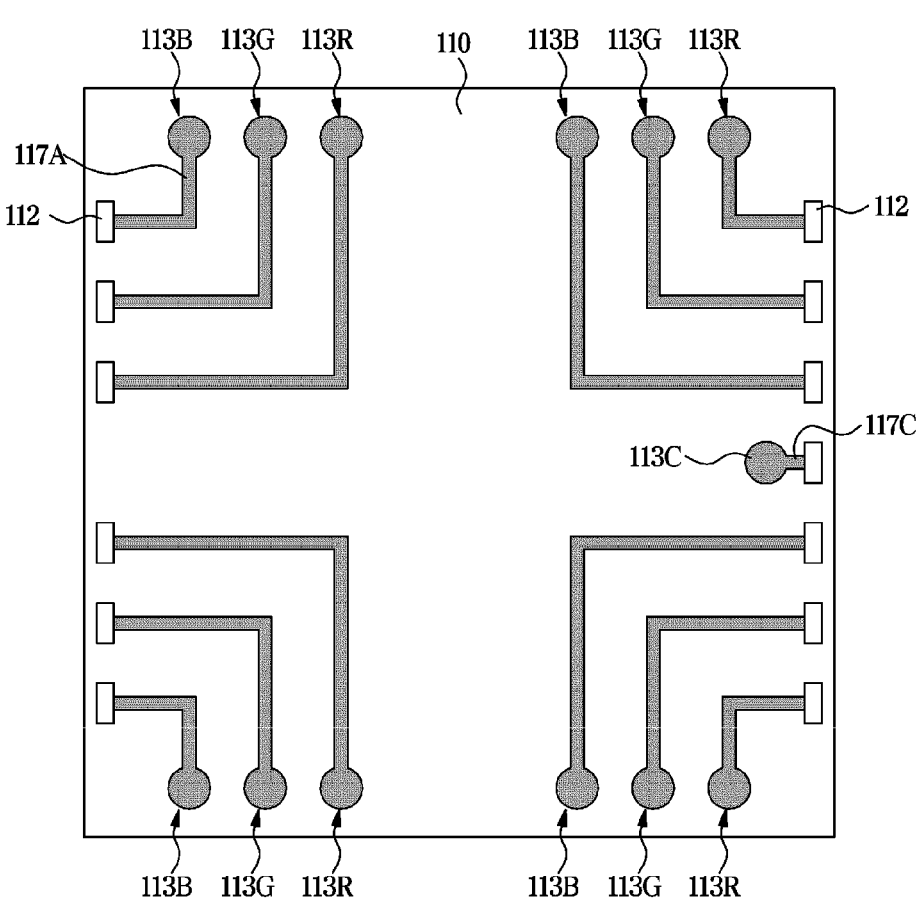
FIG. 14 is a diagram illustrating a lower surface of a micro-pixel package in which a VIA hole wiring is formed in a display module according to an embodiment.

FIG. 12 is a side cross-sectional view of a micro-pixel package in which a VIA hole wiring is formed in a display module according to an embodiment. FIG. 13 is a diagram illustrating an upper surface of the micro-pixel package in which the VIA hole wiring is formed in the display module according to an embodiment. FIG. 14 is a diagram illustrating a lower surface of a micro-pixel package in which a VIA hole wiring is formed in a display module according to an embodiment. The side cross-sectional view illustrated in FIG. 12 is a longitudinal cross-sectional view taken along line B-B' of FIG. 13.

Referring to FIG. 12, an example for electrically connecting a plurality of inorganic LEDs 120R, 120G, and 120B disposed on the upper surface of the second substrate 110 to the micro-pixel controller 130 is illustrated and connection by vertical interconnect access (VIA) holes may be used.

When the second substrate 110 is a glass substrate, VIA holes are formed in the second substrate 110 by applying Through-Glass Via (TGV) technique, and at least one VIA 113 may be formed by VIA filling performed by plating inner walls of the formed VIA holes 113 with a conductive material 113a such as copper, and filling the VIA holes with a filling material 113b.

The filling material 113b filled in the VIA holes may be a conductive or non-conductive material. In an embodiment described below, the VIA 113 penetrating the second substrate 110 is referred to as VIA hole wiring 113. The VIA hole wiring 113 may receive a signal received from the micro-pixel controller 130 through lower wiring formed on the lower surface of the second substrate 110 and the lower electrode pad 112.

FIG. 13 exemplarily illustrates a wiring structure of the upper surface of the second substrate 110. Referring to the example of FIGS. 12 and 13, a VIA hole wiring 113R for electrically connecting an anode 121 of a red inorganic LED 120R disposed on the upper surface of the second substrate 110 to the micro-pixel controller 130, a VIA hole wiring 113G for electrically connecting an anode 121 of a green inorganic LED 120G disposed on the upper surface of the second substrate 110 to the micro-pixel controller 130, and a VIA hole wiring 113B for electrically connecting an anode 121 of a blue inorganic LED 120B disposed on the upper surface of the second substrate 110 to the micro-pixel controller 130 may be formed in the form penetrating the second substrate 110.

An anode pad 111A connected to the anode 121 of each of the inorganic LEDs 120 among the upper electrode pads 111 formed on the upper surface of the second substrate 110 may be connected to the VIA hole wiring 113R, 113G, and 113B through an anode upper wiring 114 among the upper wirings of the second substrate 110.

A common reference voltage $V_{SS}$ may be applied to cathodes 122 of the plurality of inorganic LEDs 120R, 120G, and 120B. A VIA hole wiring 113C for applying the common reference voltage $V_{SS}$ to the cathodes 122 may be formed in the second substrate 110, and cathode pads 111C connected to the cathodes 122 of the inorganic LEDs 120, respectively, may be connected to the VIA hole wiring 113C through a cathode upper wiring 115 among the upper wirings of the second substrate 110.

Referring to FIG. 14, the VIA hole wiring 113 penetrating the second substrate 110 may be electrically connected to the micro-pixel controller 130 or a FPCB for supplying power through a lower wiring formed on the lower surface of the second substrate 110.

Specifically, the VIA hole wirings 113R, 113G, and 113B connected to the anodes 121 of the inorganic LEDs 120R, 120G, and 120B may be electrically connected to the lower electrode pads 112 through an anode lower wiring 117A.

A driving current $C_D$ output from the micro-pixel controller 130 may be applied to the anodes 121 of the inorganic LEDs 120R, 120G, and 120B, respectively, through the lower electrode pad 112, the anode lower wiring 117A, the VIA hole wirings 113R, 113G, and 113B, and the anode upper wiring 114.

The VIA hole wiring 113C connected to the cathodes 122 of the inorganic LEDs 120R, 120G, and 120B may be electrically connected to the FPCB for supplying power through the cathode lower wiring 117C to apply the reference voltage $V_{SS}$ to the cathodes 122 of the inorganic LEDs 120R, 120G, and 120B.

An upper wiring for electrically connecting the micro-pixel package 100 to the micro-pixel controller 130 may be formed on the upper surface of the first substrate 13. The upper wiring formed on the upper surface of the first substrate 13 electrically connect the lower electrode pad 112 of the micro-pixel package 100 to the connection pin 135 of the micro-pixel controller 130 so as to transmit a signal output from the micro-pixel controller 130 to the micro-pixel package 100.

The above-described wiring structures illustrated in FIGS. 12 to 14 are merely examples applicable to the display module 10. Therefore, various wiring structures may also be applied to embodiments of the display module 10 in addition to the above-described wiring structures.

A side wiring may also be applied to electrically connect the plurality of inorganic LEDs 120R, 120G, and 120B disposed on the upper surface of the second substrate 110 to the micro-pixel controller 130.

Figure 15:
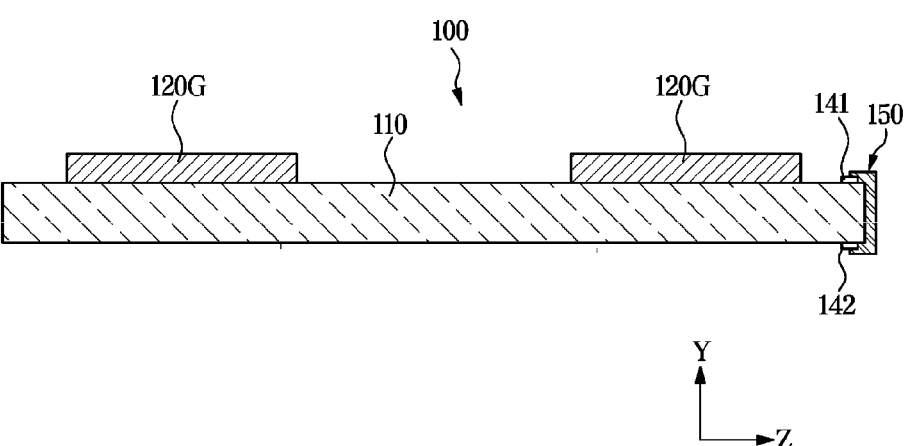
FIG. 15 is a side cross-sectional view of a micro-pixel package in which a side wiring is formed in a display module according to an embodiment.
Figure 16:
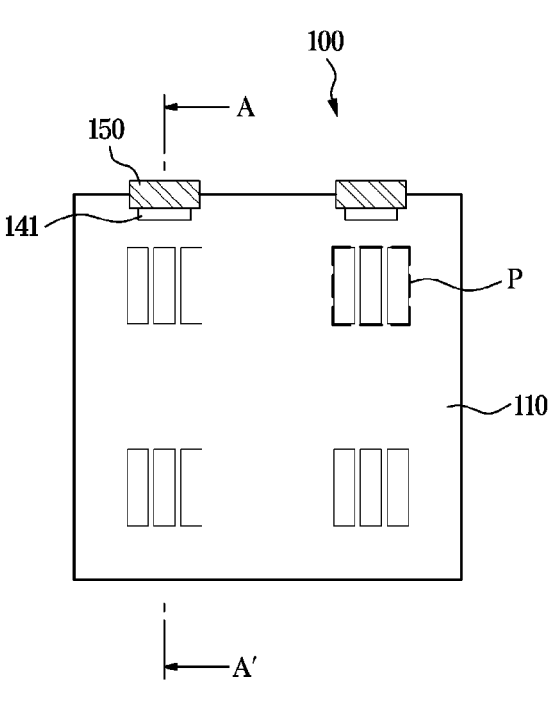
FIG. 16 is a diagram illustrating an upper surface of a micro-pixel package in which a side wiring is formed in a display module according to an embodiment.

FIG. 15 is a side cross-sectional view of a micro-pixel package in which a side wiring is formed in a display module according to an embodiment. FIG. 16 is a diagram illustrating an upper surface of the micro-pixel package in which the side wiring is formed in the display module according to an embodiment. The side cross-sectional view illustrated in FIG. 15 is a longitudinal cross-sectional view taken along line A-A' of FIG. 16.

Referring to FIGS. 15 and 16, a side wiring 150 may be formed on a side surface of the second substrate 110 to electrically connect the plurality of inorganic LEDs 120R, 120G, and 120B disposed on the upper surface of the second substrate 110 to the micro-pixel controller 130. Although two side wirings 150 are shown for descriptive convenience, it is obvious that the number of the side wiring 150 formed on one micro-pixel package 100 may vary according to design changes.

A plurality of upper connection pads 141 may be provided at border regions of the upper surface of the second substrate

110, and a plurality of lower connection pads 142 may be disposed at border regions of the lower surface of the second substrate 110.

The side wiring 150 may be formed in a shape covering at least one portion of the upper connection pad 141, a side surface of the second substrate 110, and at least one portion of the lower connection pad 142 to electrically connect the upper connection pad 141 to the lower connection pad 142.

The upper wiring extending from each of the pixels P may be electrically connected to the side wiring 150 through the upper connection pad 141.

That is, the plurality of inorganic LEDs 120 disposed on the upper surface of the second substrate 110 may receive a signal output from the micro-pixel controller 130 disposed on the upper surface of the first substrate 13 through the upper wiring, the upper connection pad 141, the side wiring 150, the lower connection pad 142, and the upper wiring formed on the upper surface of the first substrate 13.

Specifically, the anode 121 of the inorganic LED 120 may receive a driving current $C_D$ from the micro-pixel controller 130 through the side wiring 150, and the cathode 122 of the inorganic LED 120 may receive a reference voltage $V_{SS}$ from the FPCB configured to supply power through the side wiring 150.

The side wiring 150 may be formed in a method of coating a conductive material on the side surface of the second substrate 110 and the method of coating the conductive material may include one of an inkjet method, a stamping method, a screen-printing method, a metal deposition method, a bonding method using a tape, and an etching method.

In the previously discussed embodiments, the micro-pixel package and the micro-pixel controller are provided as separate chips. Hereinafter, an embodiment in which a micro-pixel package and a micro-pixel controller are integrated will be described.

Figure 17:
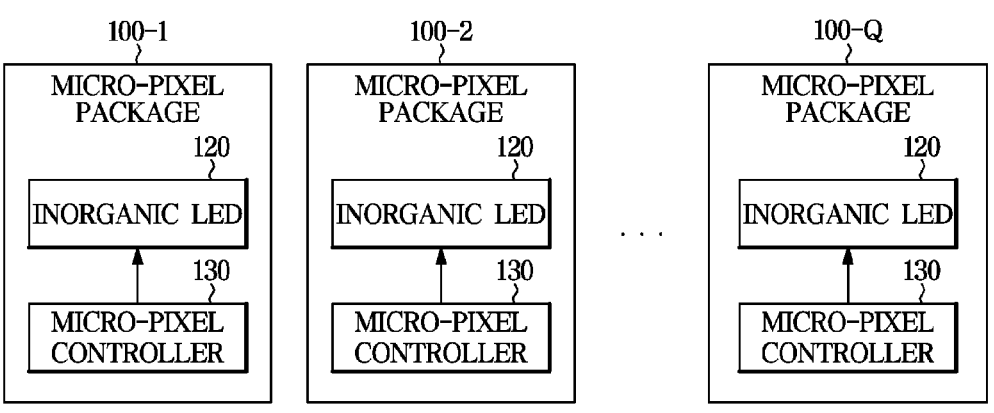
FIG. 17 is a control block diagram illustrating that each micro-pixel package includes a micro-pixel controller in a display module according to an embodiment.
Figure 18:
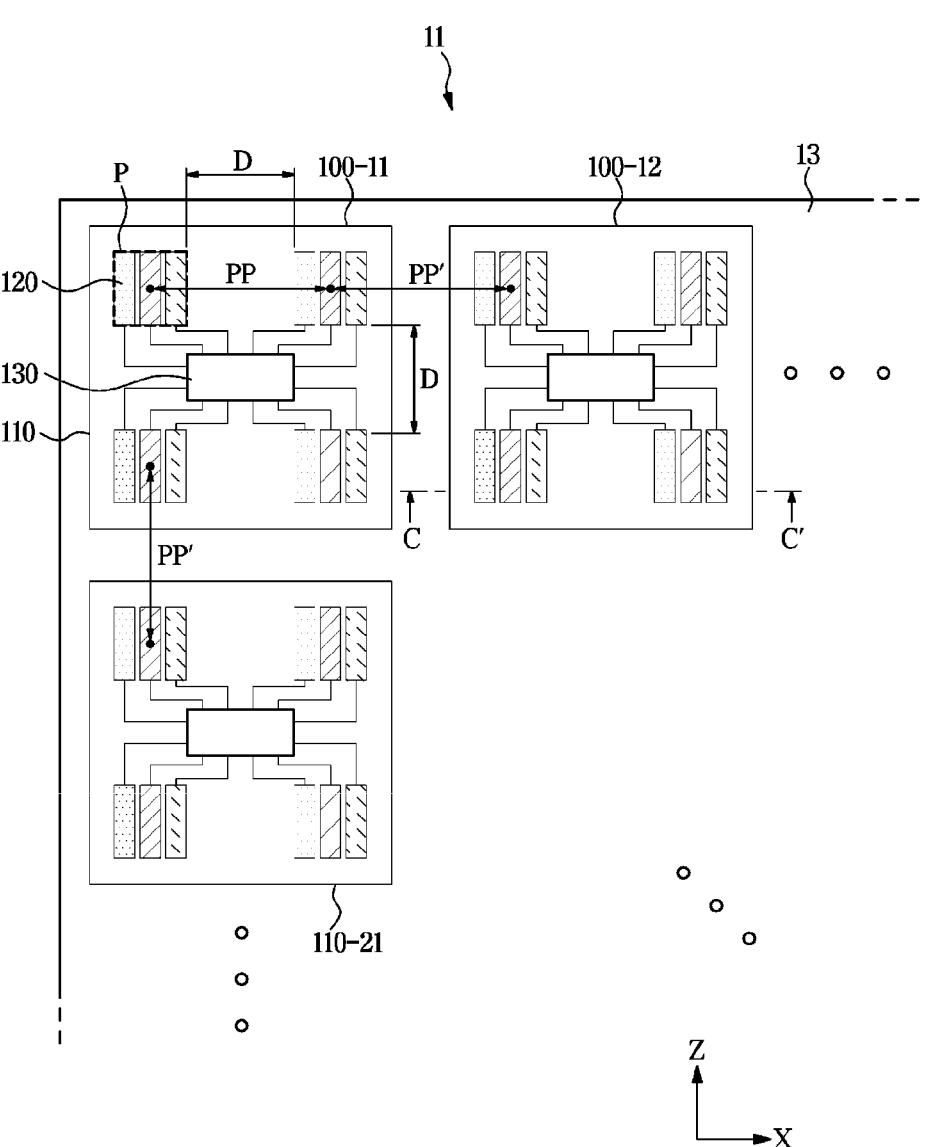
FIG. 18 is a diagram illustrating an upper surface of a first substrate on which micro-pixel packages each including a micro-pixel controller are disposed in a display module according to an embodiment.
Figure 19:
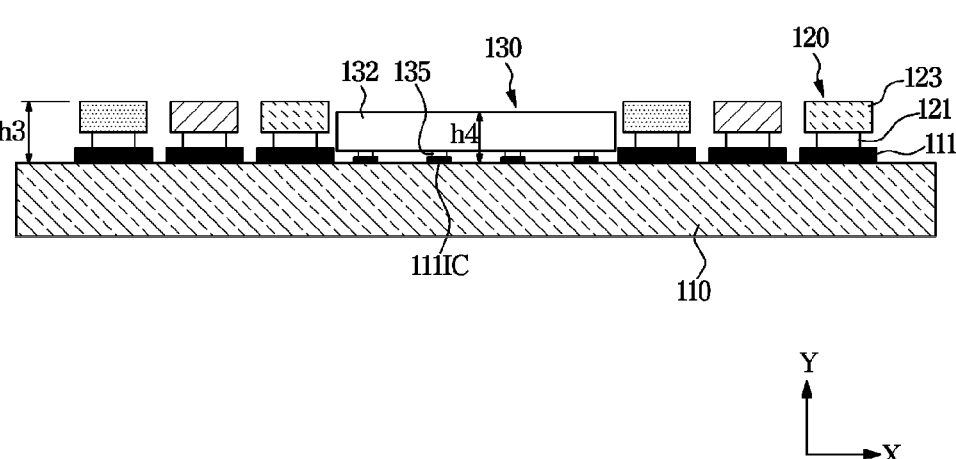
FIG. 19 is a side cross-sectional view of the first substrate on which micro-pixel packages each including a micro-pixel controller are disposed in a display module according to an embodiment.

FIG. 17 is a control block diagram illustrating that each micro-pixel package includes a micro-pixel controller in a display module according to an embodiment. FIG. 18 is a diagram illustrating an upper surface of a first substrate on which micro-pixel packages each including a micro-pixel controller are disposed in a display module according to an embodiment. FIG. 19 is a side cross-sectional view of the first substrate on which micro-pixel packages each including a micro-pixel controller are disposed in a display module according to an embodiment. FIG. 19 is a longitudinal cross-sectional view taken along line C-C' of FIG. 18.

Referring to FIG. 17, a display panel 11 may include a plurality of micro-pixel packages 100-1, 100-2, . . . , and 100-Q, and each of the plurality of micro-pixel packages 100-1, 100-2, . . . , and 100-Q may include an inorganic LED 120 and a micro-pixel controller 130. Although three or more micro-pixel packages 100 are illustrated in FIG. 17, the embodiment of the display module 10 is not limited thereto. The number of the micro-pixel packages 100 is not particularly limited as long as they are provided in plural in number (where Q is an integer equal to or greater than 2).

According to an embodiment, because the inorganic LED 120 and the micro-pixel controller 130 are provided as one package, reliability of a test for pixel circuits or inorganic LEDs may be improved and the test may be performed quickly, and defective products may be easily replaced by mounting only packages having passed the test on the first substrate 13.

Other characteristics of the display panel 11 are the same as those of the previous embodiment except that the micro-pixel package 100 and the micro-pixel controller 130 are integrated. Therefore, descriptions given above in the previous embodiments may also be applied in the same manner except for the structural or operational difference related to the integrated structure of the micro-pixel package 100 and the micro-pixel controller 130.

Referring to FIG. 18, the plurality of micro-pixel packages 100 may be arranged in two dimensions on the upper surface of the first substrate 13. Each of the plurality of micro-pixel packages 100 may include a second substrate 110, a plurality of pixels P disposed on the second substrate 110, and at least one micro-pixel controller 130 disposed on the second substrate 110 and configured to control the plurality of pixels P. Both the micro-pixel controller 130 and the pixels P may be disposed on the second substrate 110 but the micro-pixel controller 130 and the pixels are not necessarily disposed on the same layer. That is, the micro-pixel controller 130 and the pixels P may be disposed on the same layer (example of FIG. 19) or on different layers (example of FIG. 20).

The micro-pixel packages 100 may be arranged in consideration of the overall arrangement of pixels of the display module 10 and pixel pitches. For example, when the display module 10 includes pixels arranged in an M×N matrix form and the pixels are arranged in a m×n matrix form in the micro-pixel package 100, M/m micro-pixel packages 100 may be arranged in a column direction, i.e., Z-axial direction, and N/n micro-pixel packages 100 may be arranged in a row direction, i.e., the X-axial direction.

Pixel pitches PP between one pixel and adjacent pixels located on the top, bottom, and left and right sides thereof in the micro-pixel package 100 may be maintained the same. The pixel pitches PP may be maintained the same even in the unit of display module 10.

Evan when two adjacent pixels P are arranged in different micro-pixel packages 100, arrangement and distance between the two pixels P may be determined such that a pixel pitch PP' between the two pixels are maintained the same as the pixel pitch PP in the single micro-pixel package 100.

Unlike the previous embodiments, the micro-pixel controller 130 may be disposed on the upper surface of the second substrate 110 of the micro-pixel package 100 together with the plurality of inorganic LEDs 120.

One micro-pixel controller 130 may be disposed in one micro-pixel package 100 or two or more micro-pixel controllers 130 may be disposed in one micro-pixel package 100. In an embodiment described below, a case in which one micro-pixel controller 130 is disposed will be described as an example.

The micro-pixel controller 130 may be disposed in a space where the inorganic LEDs 120 are not disposed. To this end, a length of a shorter side of the upper surface or lower surface of the micro-pixel controller 130 may be smaller than a distance D between borders of adjacent pixels P. For example, the distance D between the borders of adjacent pixels P may refer to a distance between inorganic LEDs 120 included in different pixels P among adjacent inorganic LEDs 120.

For example, the micro-pixel controller 130 may be disposed at the center of the display module 10 for efficient wiring (when one micro-pixel controller per one micro-pixel package is provided). That is, the center of the micro-pixel controller 130 may be arranged to correspond to the center of the second substrate 110. However, the expression 'correspond to' may include not only a case in which the positions are completely identical to each other, but also a case in which the positions are identical to each other within a predetermined error range.

In addition, when one micro-pixel controller 130 controls four pixels P as shown in the example of FIG. 18, the micro-pixel controller 130 may be disposed at a position spaced apart from the center of each of the four pixels at the same distance.

However, the micro-pixel controller 130 is not necessarily disposed at the center of the micro-pixel package 100 and the micro-pixel controller 130 may also be disposed at a position other than the center of the micro-pixel package 100 according to various design changes.

Referring to FIG. 19, not only an upper electrode pad 111 for connection to the inorganic LED 120 but also an upper electrode pad 111IC for connection to the micro-pixel controller 130 may be provided on the upper surface of the second substrate 110. As in the previous embodiments described above, the micro-pixel controller 130 may include a third substrate 132, a pixel circuit 131 disposed on the third substrate 132, and a connection pin 135 for input and output of a signal, wherein the connection pin 135 disposed on the lower surface of the third substrate 132 may be electrically connected to the upper electrode pad 111IC disposed on the upper surface of the second substrate 110.

By locating the upper ends of the micro-LEDs 120, which are disposed on the upper surface of the second substrate 110 together with the micro-pixel controller 130, to be higher than the upper end of the micro-pixel controller 130, loss of viewing angle caused by the micro-pixel controller 130 may be prevented.

Specifically, a height h3 from the upper surface of the second substrate 110 to the upper surface of the inorganic LED 120, i.e., to the light emitting surface, may be greater than a height h4 from the upper surface of the second substrate 110 to the upper end of the micro-pixel controller 130.

The upper end of the micro-pixel controller 130 may be defined differently according to arrangements of components provided on the micro-pixel controller 130. For example, when the components such as the pixel circuit 131 are disposed on the lower surface of the third substrate 132, the upper end of the micro-pixel controller 130 may be defined as the upper surface of the third substrate 132.

On the contrary, when the components such as the pixel circuit 131 are disposed on the upper surface of the third substrate 132, the upper end of the micro-pixel controller 130 may be defined as an upper end of a component disposed on the third substrate 132, e.g., an upper end of a component protruding to have the greatest height, among the components.

Adjustment of the heights of the upper end of the micro-pixel package 100 and the upper end of the micro-pixel controller 130 may be performed according to various methods. For example, the heights of the electrodes 121 and 122 or the electrode pad 111 which are disposed on or connected to the inorganic LED 120 may be adjusted to be greater than the height of the connection pin 135 or the electrode pad 111 disposed on or connected to the micro-pixel controller 130.

Figure 20:
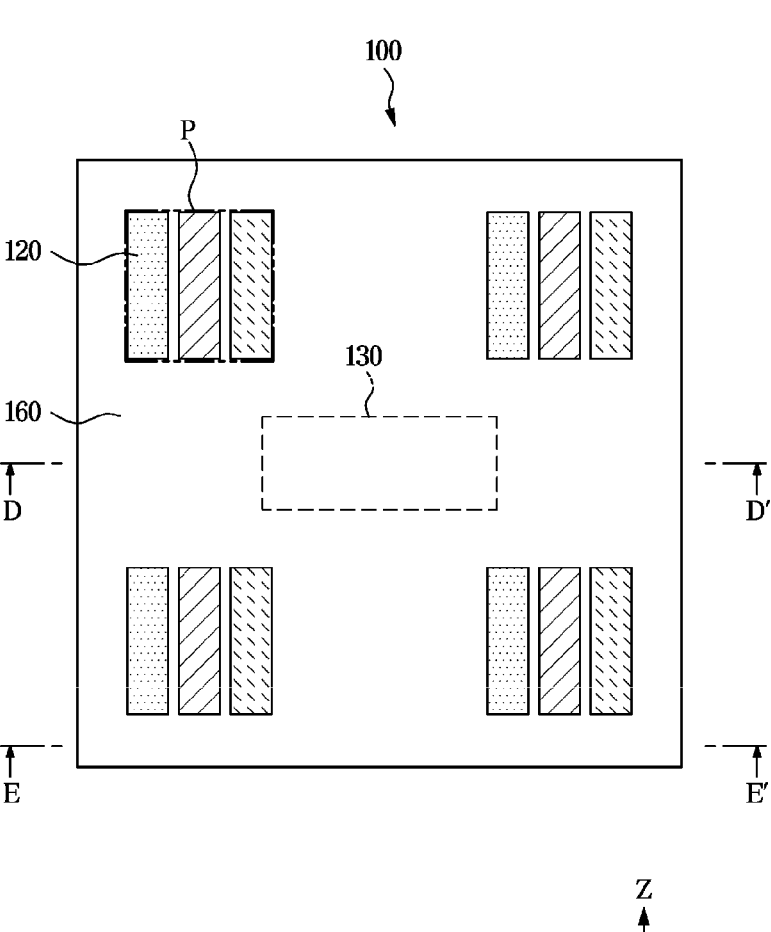
FIG. 20 is a diagram illustrating an upper surface of a micro-pixel package when a micro-pixel controller is disposed in a different layer from that of inorganic LEDs in a display module according to an embodiment.
Figure 21:
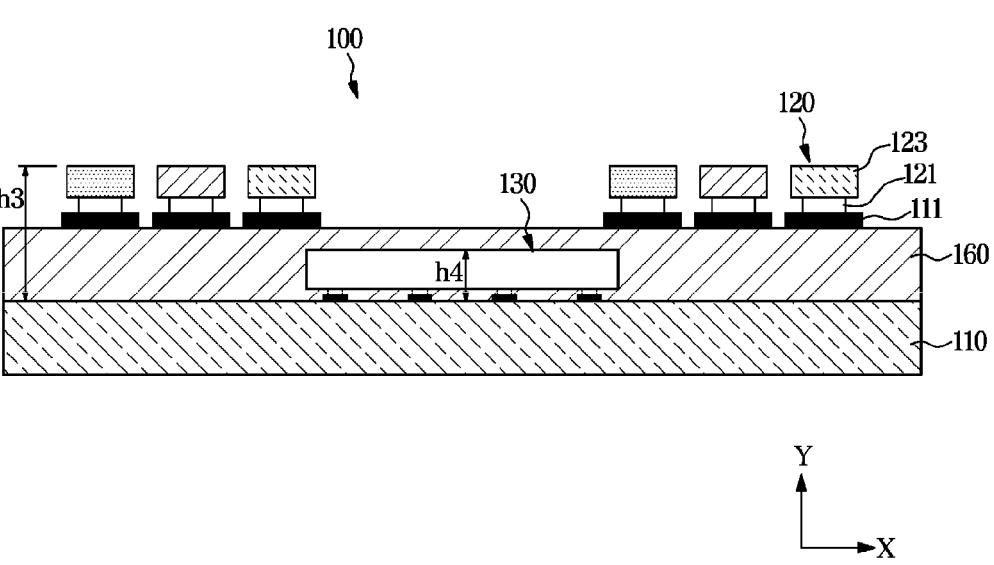
FIGS. 21 and 22 are side cross-sectional views of the micro-pixel package when the micro-pixel controller is disposed in a different layer from that of the inorganic LEDs in the display module according to an embodiment.
Figure 22:
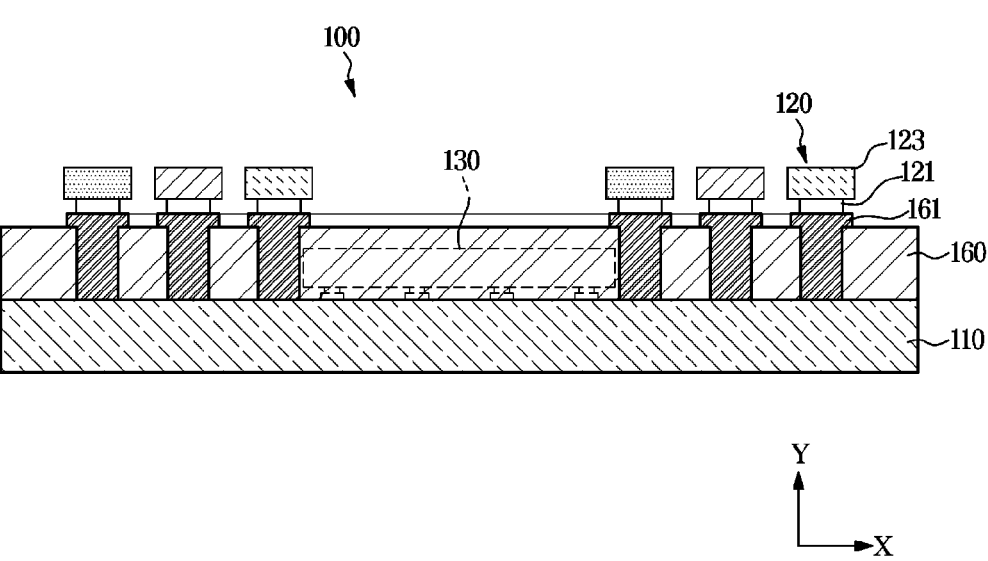
Figure 23:
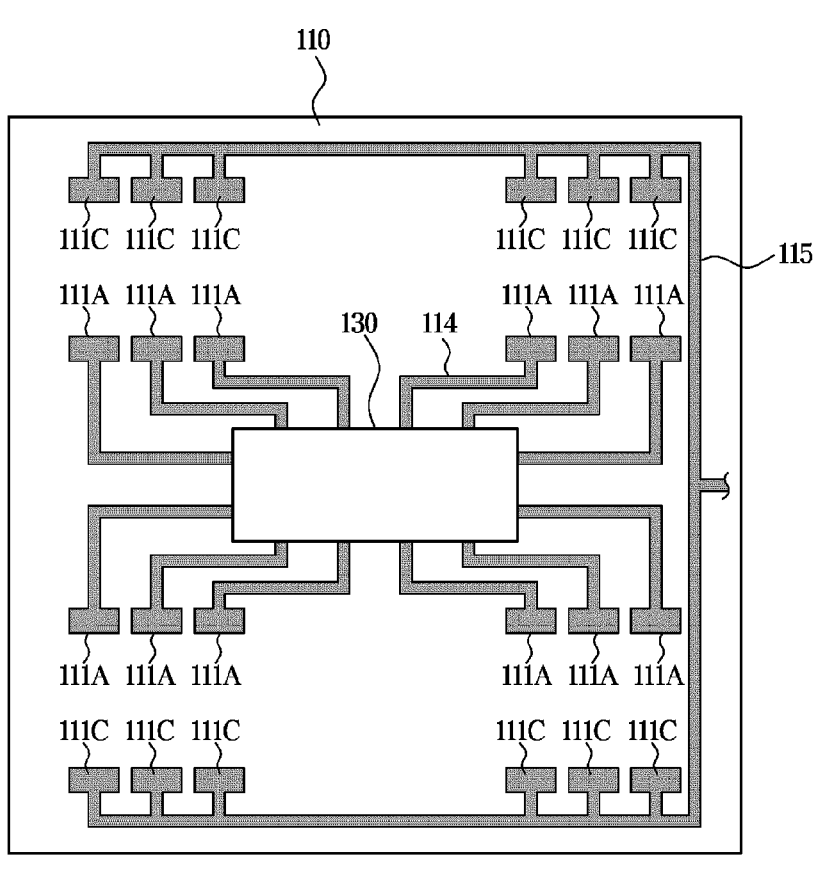
FIG. 23 is a diagram illustrating an upper surface of a second substrate when the micro-pixel controller is disposed in a different layer from that of the inorganic LEDs.
Figure 23:
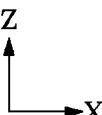

FIG. 20 is a diagram illustrating an upper surface of a micro-pixel package when a micro-pixel controller is disposed in a different layer from that of inorganic LEDs in a display module according to an embodiment. FIGS. 21 and 22 are side cross-sectional views of the micro-pixel package when the micro-pixel controller is disposed in a different layer from that of the inorganic LEDs in the display module according to an embodiment. FIG. 23 is a diagram illustrating an upper surface of a second substrate when the micro-pixel controller is disposed in a different layer from that of the inorganic LEDs according to an embodiment. FIG. 21 is a longitudinal cross-sectional view taken along line D-D' of FIG. 20. FIG. 22 is a longitudinal cross-sectional view taken along line E-E' of FIG. 20.

Referring to FIGS. 20 and 21, the micro-pixel controller 130 may be disposed on the upper surface of the second substrate 110, and a buffer layer 160 may be disposed on the micro-pixel controller 130. A plurality of inorganic LEDs 120 may be disposed on the buffer layer 160.

A height h3 from the second substrate 110 to the upper end of the inorganic LED 120 may be greater than a height h4 from the second substrate 110 to the upper end of the micro-pixel controller 130 by the buffer layer 160 disposed between the micro-pixel controller 130 and the inorganic LEDs 120.

The buffer layer 160 may be formed of an insulating material and may be implemented as a single layer or two or more layers.

An example of electrically connecting the inorganic LED 120 to the micro-pixel controller 130 which are disposed on different layers is shown in FIG. 22. Referring to FIG. 22, an electrode pad 161 for electrically connecting the inorganic LED 120 to the micro-pixel controller 130 may be disposed on the buffer layer 160 and the electrode pad 161 may penetrate the buffer layer 160 to be connected to the upper wiring of the second substrate 110.

Referring to FIG. 23, the electrode pad 161 connected to the anode 121 of the inorganic LED 120 may be electrically connected to the micro-pixel controller 130 through the anode pad 111A and the anode wiring 114 formed on the upper surface of the second substrate 110. Through such connection, a driving current output from the micro-pixel controller 130 may be supplied to the anode 121 of the inorganic LED 120.

The electrode pad 161 connected to the cathode 122 of the inorganic LED 120 may be electrically connected to the FPCB configured to supply power through the cathode pad 111C and the cathode wiring 115 formed on the upper surface of the second substrate 110. Through such connection, a common reference voltage $V_{SS}$ may be supplied to the cathode 122 of the inorganic LED 120.

The wiring structures illustrated in FIGS. 22 and 23 are merely examples applicable to the display module 10. Therefore, the driving current and the reference voltage may be supplied to the inorganic LED 120 by applying various other wiring structures in addition to the above-described wiring structures.

Figure 24:
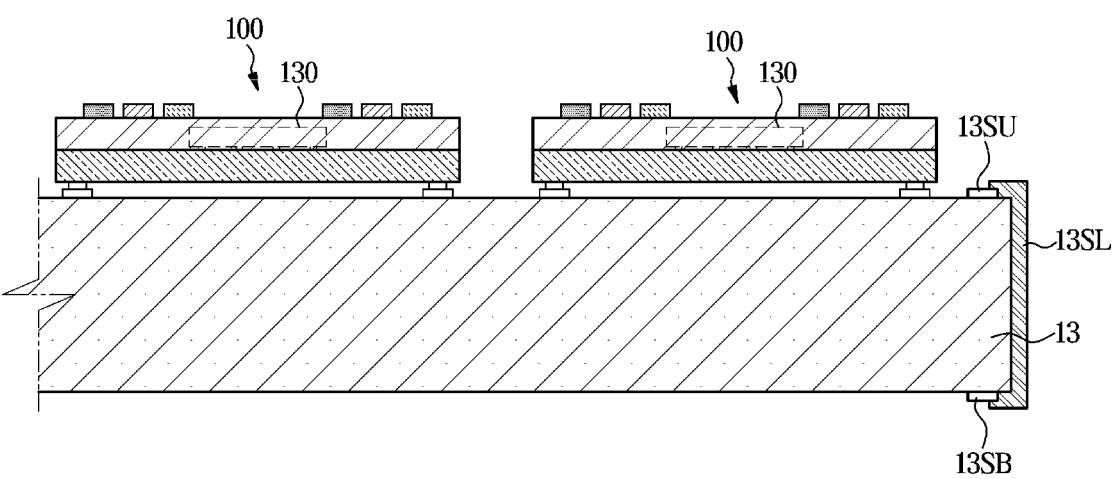
FIG. 24 is a side cross-sectional view of a first substrate in which a side wiring is formed in a display module according to an embodiment.

FIG. 24 is a side cross-sectional view of a first substrate in which a side wiring is formed in a display module according to an embodiment.

In order to transmit a signal received from the driver IC 200 to the micro-pixel controller 130 disposed on the upper surface of the first substrate 13, a side wiring or a VIA hole wiring may be used.

When the side wiring is used, an upper connection pad 13SU provided on the upper surface of the first substrate 13 may be electrically connected to a lower connection pad 13SB provided on the lower surface of the first substrate 13 by a side wiring 13SL as shown in FIG. 24.

Because a driving signal and a power $V_{DD}$ and $V_{SS}$ may be supplied through the side wiring 13SL, both the driving signal and the power supplied through the side wiring 13SL may be input to the micro-pixel package 100 in the case where the micro-pixel package 100 includes the micro-pixel controller 130.

When the micro-pixel controller 130 is provided separately from the micro-pixel package 100, the driving signal and the supply voltage $V_{DD}$ supplied through the side wiring 13SL may be input to the micro-pixel controller 130, and the reference voltage $V_{SS}$ may be input to the micro-pixel package 100.

In the display module 10 according to an embodiment, because the inorganic LED 120 and the micro-pixel controller 130 configured control the same are mounted on the upper surface of the first substrate 13, there is no need to form a complex wiring for connecting the inorganic LED 120 to a TFT configured to control the same on the lower surface of the first substrate 13 except for a wiring for connection to the FPCB. Therefore, a wiring process of the module substrate may become easier.

Figure 25:
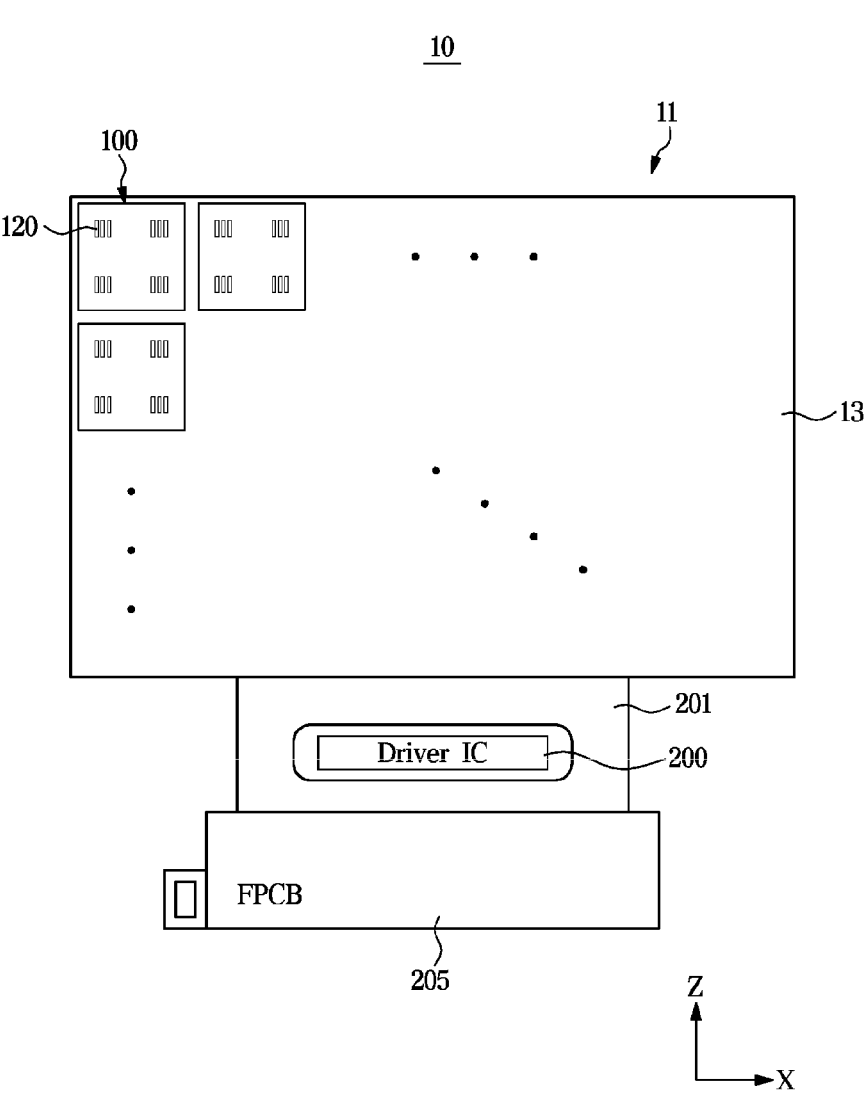
FIG. 25 is a diagram exemplarily illustrating a method of electrically connecting a display panel to a driver IC in a display module according to an embodiment.

FIG. 25 is a diagram exemplarily illustrating a method of electrically connecting a display panel to a driver IC in a display module according to an embodiment. For descriptive convenience, the micro-pixel controller 130 is omitted in FIG. 25.

As described above, the micro-pixel controller 130 may control the inorganic LED 120 in accordance with a driving signal received from the driver IC 200.

The driver IC 200 may be electrically connected to the display panel 11 by one of various bonding methods such as Chip on Film (COF) or Film on Glass (FOG) bonding, Chip on Glass (COG) bonding, and Tape Automated Bonding (TAB).

For example, when the COF bonding is used, as shown in FIG. 25, a driver IC 200 is mounted on a film 201, and one end of the film 201 mounted with the driver IC 200 may be electrically connected to the first substrate 13 and the other end may be electrically connected to an FPCB 205. In order to electrically connecting the film 201 to the first substrate 13, the film 201 may be connected to a lower electrode pad provided on the lower surface of the first substrate 13.

A signal received from the driver IC 200 may be transmitted to the micro-pixel controller 130 disposed on the upper surface of the first substrate 13 through the side wiring or VIA hole wiring formed on the first substrate 13.

Figure 26:
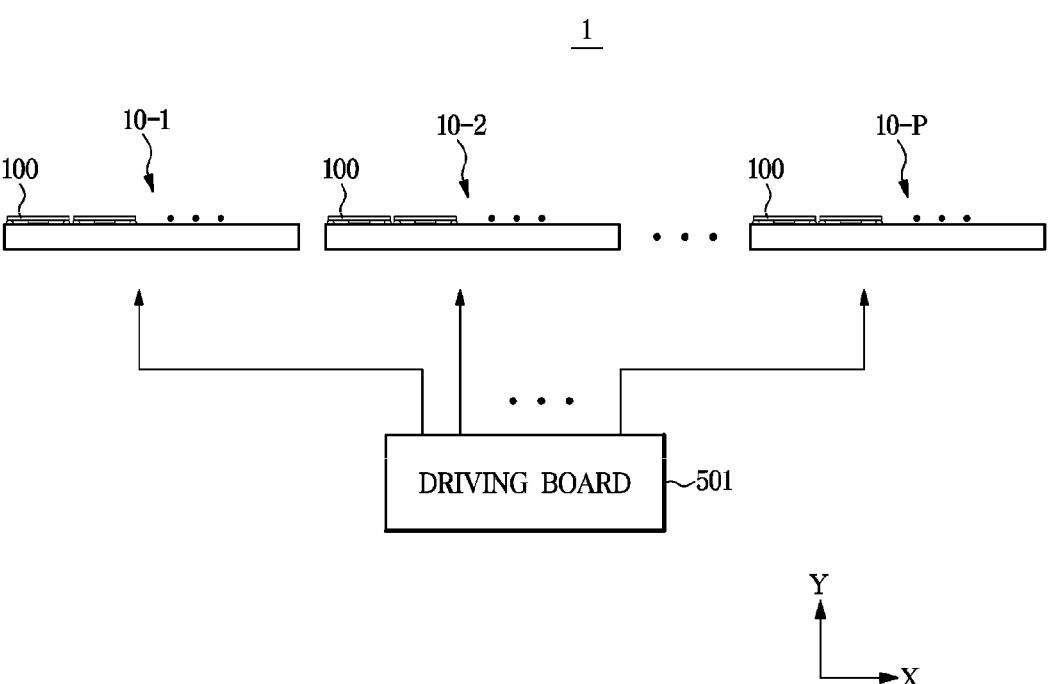
FIGS. 26 and 27 are diagrams exemplarily illustrating signals transmitted to a plurality of tiled display modules in a display apparatus according to an embodiment.
Figure 27:
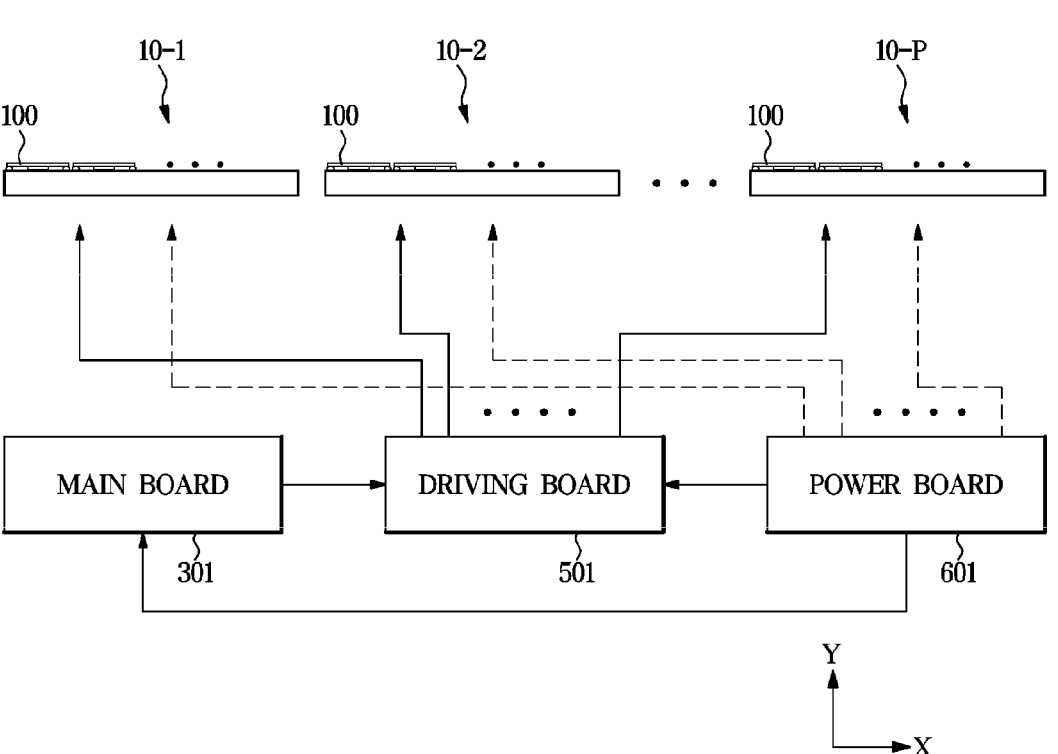

FIGS. 26 and 27 are diagrams exemplarily illustrating signals transmitted to a plurality of tiled display modules in a display apparatus according to an embodiment.

As described above, a display apparatus 1 having a large-area screen may be implemented by tiling a plurality of display modules 10-1, 10-2, . . . , and 10-n. Because FIGS. 26 and 27 are diagrams illustrating the display apparatus 1 on an XY plane, only one-dimensional arrangement of the display modules 10-1, 10-2, . . . , and 10-P is illustrated. However, as described above with reference to FIG. 1, the plurality of display modules 10-1, 10-2, . . . , and 10-n may also be arranged in two dimensions.

As described above, the display panel 11 may be connected to the FPCB 205 through the 201 on which the driver IC 200 is mounted. The FPCB 205 may be connected to a driving board 501 to electrically connect the display module 10 to the driving board 501.

A timing controller 500 may be provided on the driving board 501. Therefore, the driving board 501 may also be referred to as a T-con board. The plurality of display modules 10-1, 10-2, . . . , and 10-n may receive image data, a timing control signal, and the like from the driving board 501.

Referring to FIG. 27, the display apparatus 1 may further include a main board 301 and a power board 601. The above-described main controller 300 may be provided on the main board 301, and a power supply circuit required to supply power to the plurality of display modules 10-1, 10-2, . . . , and 10-n may be provided on the power board 601.

The power board 601 may be electrically connected to the plurality of display modules 10-1, 10-2, . . . , and 10-n through the FPCB, and the supply voltage $V_{DD}$, the reference voltage $V_{SS}$, and the like may be supplied to the plurality of display modules 10-1, 10-2, . . . , and 10-n connected through the FPCB.

For example, the supply voltage $V_{DD}$ received through the power board 601 may be applied to the micro-pixel controller 130 through the side wiring or the VIA hole wiring formed on the first substrate 13. The reference voltage $V_{SS}$ received through the power board 601 may be applied to the micro-pixel package 100 through the side wiring or the VIA hole wiring formed on the first substrate 13.

Although the plurality of display modules 10-1, 10-2, . . . , and 10-n sharing the driving board 501 are described in the previous example, a separate driving board 501 may be connected to each display module 10. Alternatively, the plurality of display modules 10-1, 10-2, . . . , and 10-n may be grouped and one driving board 501 may be connected to each group.

Figure 28:
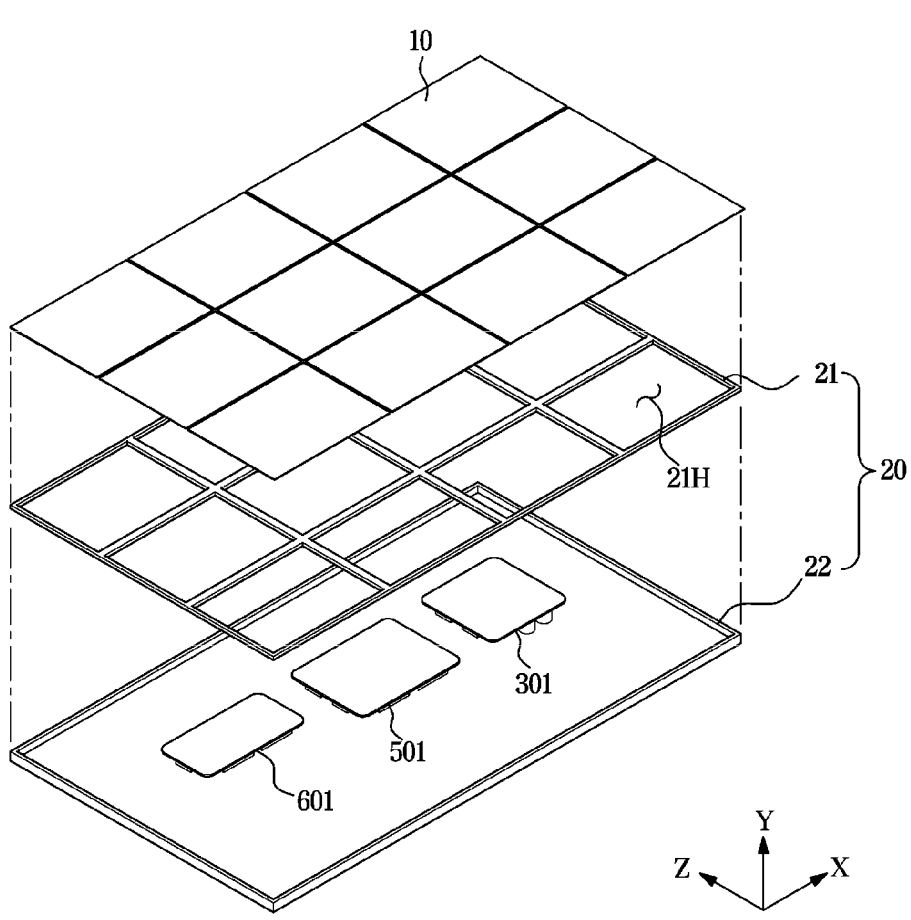
FIG. 28 is a diagram for describing a method of coupling a plurality of display modules to a housing in a display apparatus according to an embodiment.

FIG. 28 is a diagram for describing a method of coupling a plurality of display modules to a housing in a display apparatus according to an embodiment.

As described above, the plurality of display modules 10 may be fixed to the housing 20 in a two-dimensional matrix form. Referring to the example of FIG. 28, the plurality of display modules 10 may be installed in a frame 21 disposed thereunder, and the frame 21 may have a two-dimensional mesh structure having some open regions corresponding to the plurality of display modules 10.

Specifically, the frame 21 may have openings 21H in the same number as that of the display modules 10, and the openings 21H may be disposed in the same arrangement as that of the plurality of display modules 10.

Edge regions of the lower surface of each of the plurality of display modules 10 may be mounted on the frame 21. The edge regions of the lower surface may be regions where a circuit device or a wiring are not formed.

The plurality of display modules 10 may be mounted on the frame 21 using a magnetic force by a magnet, using a mechanical structure, or using an adhesive. Methods of mounting the display modules 10 on the frame 21 are not particularly limited.

The driving board 501, the main board 301, and the power board 601 may be disposed under the frame 21 and may be connected to the plurality of display modules 10, respectively, through the openings 21H formed in the frame 21.

A lower cover 22 may be coupled to a lower portion of the frame 21 and may define the external appearance of the lower surface of the display apparatus 1.

Although the display modules 10 arranged in two dimensions are described in the above-described example, the display modules 10 may also be arranged in one dimension and the structure of the frame 21 may also be modified into a one-dimensional mesh structure in this case.

In addition, the above-described shape of the frame 21 is merely an example applicable to the display apparatus and the display modules 10 may be fixed thereto by using a frame having various shapes.

Figure 29:
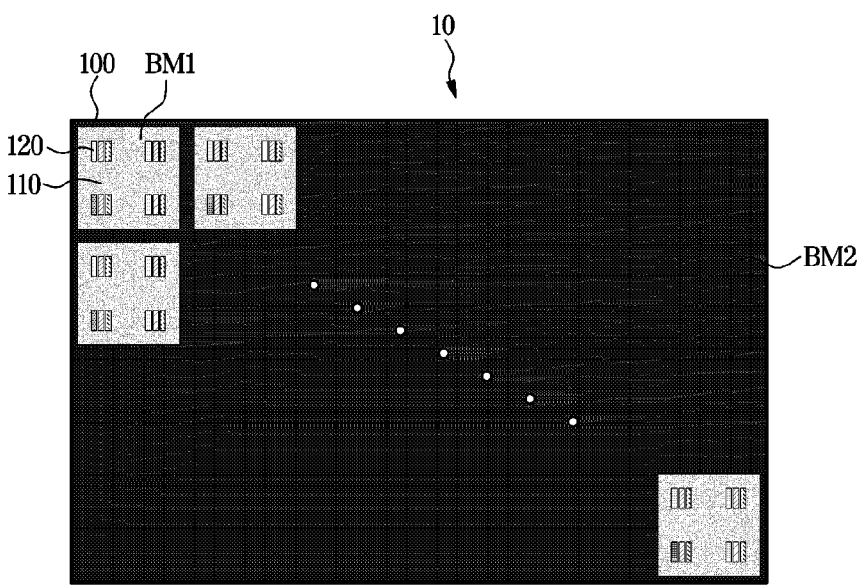
Figure 30:
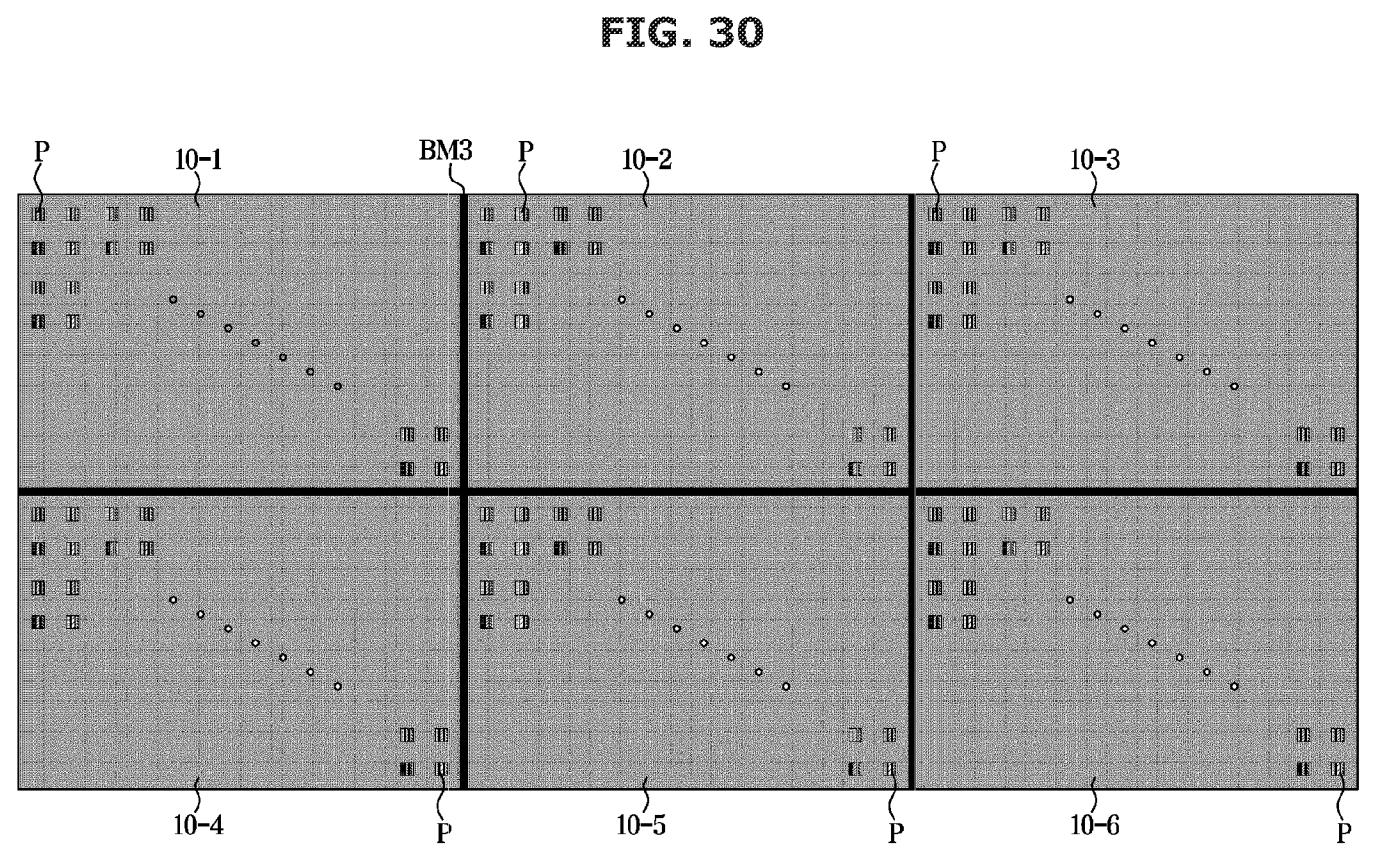

FIGS. 29 and 30 are diagrams illustrating examples of BM processing performed in a plurality of display modules in a display apparatus according to an embodiment.

Referring to FIG. 29, each of the micro-pixel packages 100 may be processed with a black matric (BM) to block light unnecessary for realizing an image, preventing diffused reflection of light in voids between pixels, and improve contrast ratio.

For example, a black matrix layer BM1 may be formed on the upper surface of the second substrate 110 using various BM processing methods, e.g., by printing a black ink on the upper surface of the second substrate 110 or the upper surface of the buffer layer 160, by forming a pattern thereon using a black photosensitive material, or by using black ACF when the inorganic LEDs 120 are mounted on the second substrate 110.

In addition, diffused reflection of light in voids between chips may also be prevented by performing BM processing in space between the plurality of micro-pixel packages 100 or space between the plurality of micro-pixel packages 100 and the plurality of micro-pixel controllers 130. To this end, a black matrix layer BM2 may also be formed on the upper surface of the first substrate 13 using one of various methods, e.g., by printing a black ink on the upper surface of the first substrate 13 or forming a pattern thereon using a black photosensitive material.

Referring to FIG. 30, BM processing may also be performed in space between the plurality of display modules 10. For example, by disposing a side member BM3 formed of a light-absorbing material on side surfaces of each of the plurality of display modules 10-1 to 10-6, particularly, side surfaces adjacent to other display modules 10, diffused reflection of light may be prevented in voids between modules and seamless effects may be obtained.

Hereinafter, a method of manufacturing a display module according to an embodiment will be described. According to the method of manufacturing a display module, the above-described display module 10 may be manufactured. Therefore, although not particularly mentioned, descriptions given above with reference to FIGS. 1 to 30 may also be equally applied to the method of manufacturing a display module according to an embodiment.

Figure 31:
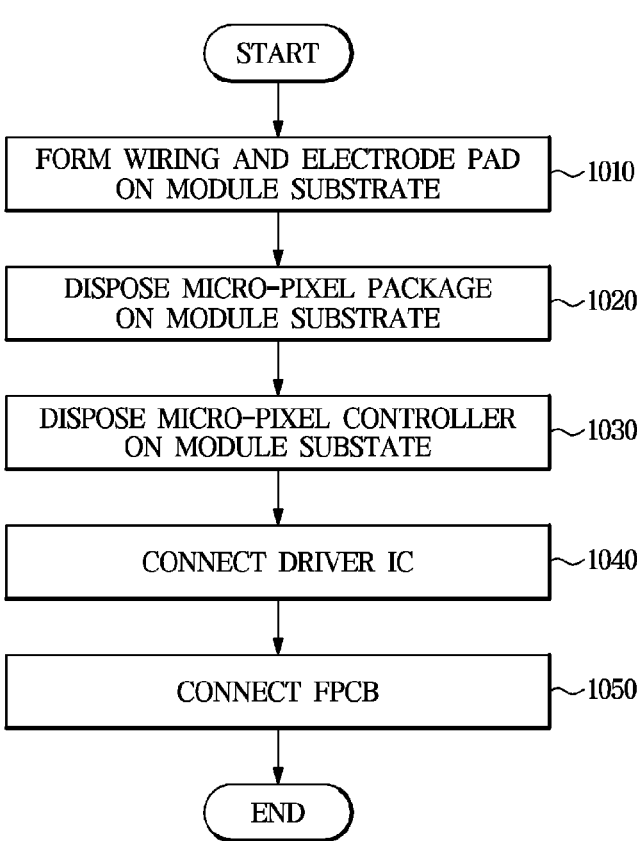
FIG. 31 is a flowchart of a method of manufacturing a display module according to an embodiment.

FIG. 31 is a flowchart of a method of manufacturing a display module according to an embodiment. FIGS. 32 to 36 are diagrams illustrating a display module manufactured by the method of manufacturing a display module according to an embodiment.

Referring to FIG. 31, wirings and electrode pads may be formed on a module substrate (operation 1010)

The module substrate may refer to the above-described first substrate 13, and the wirings and the electrode pads may be formed on the upper surface of the first substrate 13. For example, the wirings and the electrode pads may be formed on the first substrate 13 by forming a layer of a metal material such as copper on the upper surface of the first substrate 13 and performing a photolithography process including application, exposure, and development of a photosensitive material and an etching process to selectively remove unnecessary portions.

Figure 32:
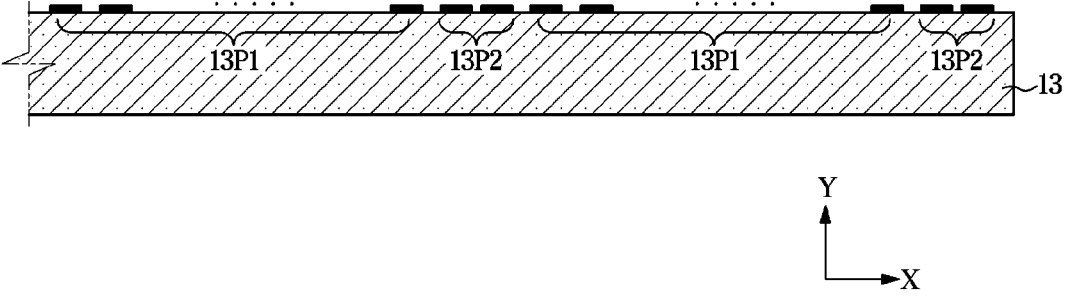
FIGS. 32 to 36 are diagrams illustrating a display module manufactured by the method of manufacturing a display module according to an embodiment.

FIG. 32 is a side cross-sectional view of a display module including electrode pads formed therein and fabricated according to the method of manufacturing a display module according to an embodiment.

Referring to FIG. 32, according to the above-described process, an upper connection pad 13P1 for connection to the micro-pixel package 100 and an upper connection pad 13P2 for connection to the micro-pixel controller 130 may be formed on the upper surface of the first substrate 13. An upper wiring for interconnection between the upper connection pad 13P1 for connection to the micro-pixel package 100 and the upper connection pad 13P2 for connection to the micro-pixel controller 130 may also be formed thereon, and an upper wiring for transmitting a driving signal or power received through the FPCB to the micro-pixel package 100 or the micro-pixel controller 130 may also be formed thereon.

Referring back to FIG. 31, the micro-pixel packages are disposed on the module substrate (operation 1020), and the micro-pixel controllers are disposed on the module substrate (operation 1030).

The micro-pixel package 100 may be prepared by transferring a plurality of inorganic LEDs 120 to a package substrate 110, and the structure and operation thereof are the same as those described above with reference to FIGS. 8 to 16.

Before arranging the micro-pixel packages 110 on the first substrate 13, the quality of the inorganic LEDs 120 may be tested individually and only the micro-pixel packages 100 having passed the quality test may be mounted on the first substrate 13. Therefore, the quality test and replacement of defective products may be performed more easily when compared to a case in which inorganic LEDs 120 are directly mounted on a module substrate.

The micro-pixel controller 130 may be fabricated by forming a pixel circuit 131 configured to control the inorganic LED 120 on a control substrate 132, and the structure and operation thereof are the same as those described above with reference to FIGS. 6 to 11.

Before mounting the micro-pixel controllers 130 on the first substrate 13, a circuit test may be performed individually and only the micro-pixel controllers 130 having passed the circuit test may be mounted on the first substrate 13. Therefore, the circuit test and replacement of defective products may be performed more easily when compared to a case in which TFT circuits are directly mounted on a module substrate.

Figure 33:
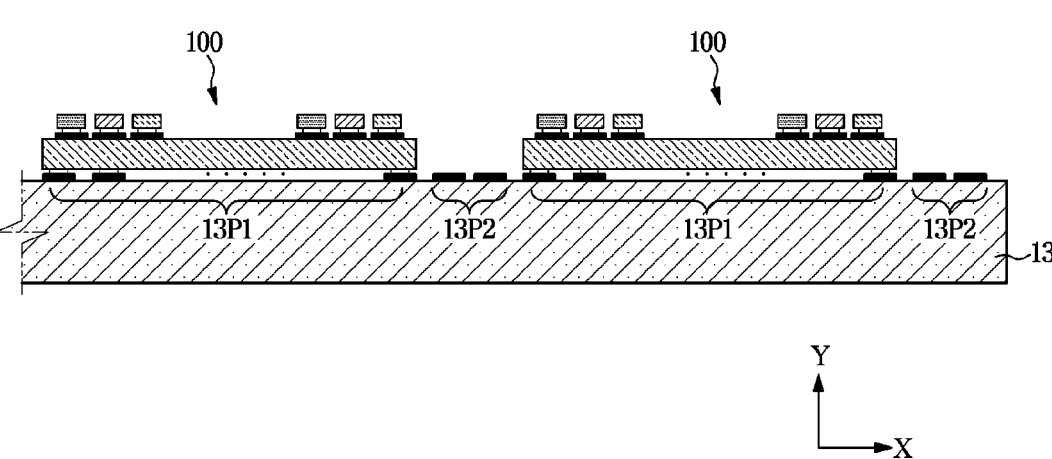
Figure 34:
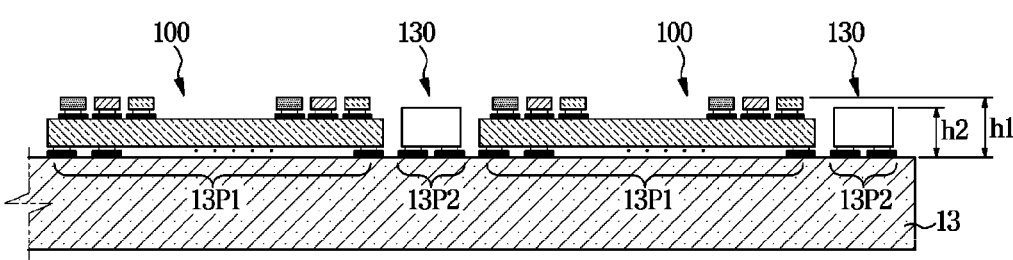
Figure 34:
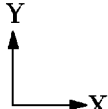

FIG. 33 is a side cross-sectional view of a display module including micro-pixel packages arranged therein and fabricated according to the method of manufacturing a display module according to an embodiment. FIG. 34 is a side cross-sectional view of a display module including micro-pixel controllers arranged therein and fabricated according to the method of manufacturing a display module according to an embodiment.

Referring to FIG. 33, the micro-pixel package 100 may be disposed on the first substrate 13 by electrically connecting the lower electrode pad 112 provided under the micro-pixel package 100 to the upper connection pad 13P1 formed on the upper surface of the first substrate 13. For example, the upper connection pad 13P1 of the first substrate 13 may be electrically connected to the lower electrode pad 112 of the micro-pixel package 100 by soldering or using a conductive adhesive.

Referring to FIG. 34, the micro-pixel controller 130 may be disposed on the first substrate 13 by electrically connecting the connection pin 135 provided under the micro-pixel controller 130 to the upper connection pad 13P2 formed on the upper surface of the first substrate 13. For example, the upper connection pad 13P2 of the first substrate 13 may be electrically connected to the connection pin 135 of the micro-pixel controller 130 by soldering or using a conductive adhesive.

In addition, loss of viewing angle caused by the micro-pixel controllers 130 may be prevented by locating upper ends of the micro-pixel packages 100 disposed on the same surface as that of the micro-pixel controllers 130 to be higher than upper ends of the micro-pixel controllers 130.

To this end, a height h1 from the upper surface of the first substrate 13 to the upper surface of the inorganic LED 120, i.e., to the light emitting surface, may be greater than a height h2 from the upper surface of the first substrate 13 to the upper end of the micro-pixel controller 130.

Although the micro-pixel packages 100 are disposed first according to the flowchart herein, the micro-pixel packages 100 and the micro-pixel controllers 130 may be disposed in a different order or simultaneously.

Referring back to FIG. 31, the driver IC is connected to the module substrate (operation 1040).

The driver IC 200 may be connected to the first substrate 13 by various bonding methods such as Chip on Film (COF) or Film on Glass (FOG) bonding, Chip on Glass (COG) bonding, and Tape Automated Bonding (TAB).

Figure 35:
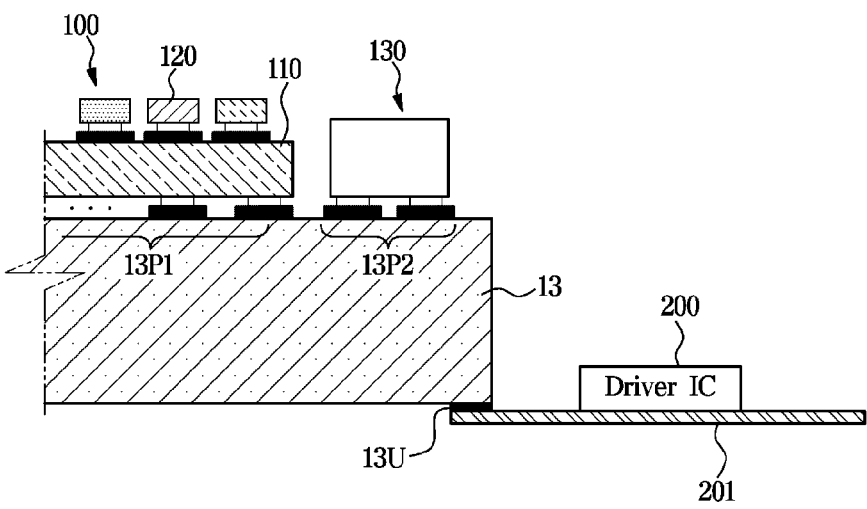

FIG. 35 is a side cross-sectional view of a first substrate 13 connected to a driver IC 200. For example, in the case of using COF bonding, as shown in FIG. 35, the driver IC 200 may be mounted on the film 201, and one end of the film 201 on which the driver IC 200 is mounted may be electrically connected to the first substrate 13.

For example, one end of the film 201 mounted with the driver IC 200 may be electrically connected to a lower electrode pad 13U disposed on the lower surface of the first substrate 13, and the lower electrode pad 13U electrically connected to the film 201 mounted with the driver IC 200 may be electrically connected to the micro-pixel controller 130 disposed on the upper surface of the first substrate 13 through the side wiring or the VIA hole wiring. The micro-pixel controller 130 may receive a driving signal from the driver IC 200 through such connection.

Referring back to FIG. 31, a FPCB may be connected to the module substrate (operation 1050).

Figure 36:
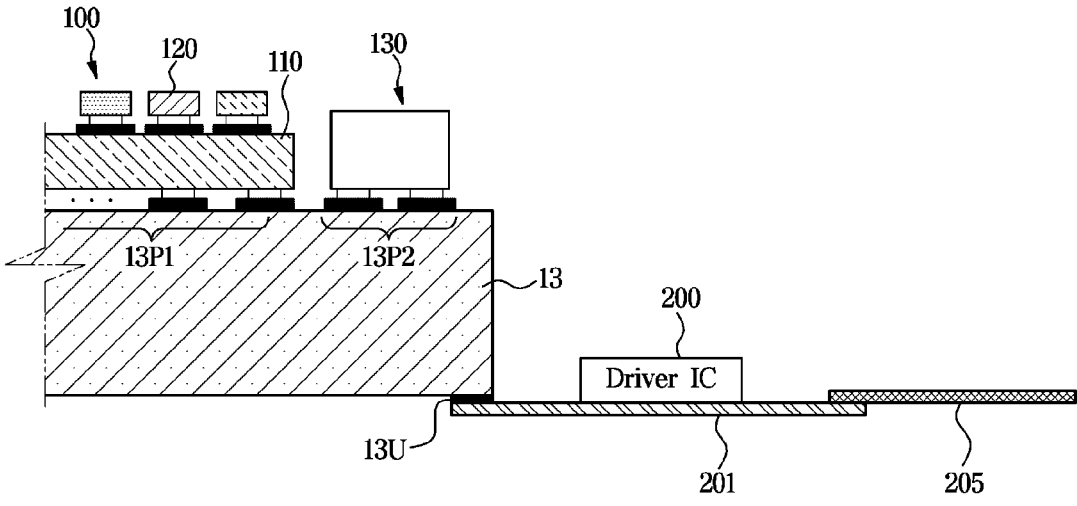

FIG. 36 is a side cross-sectional view of a first substrate 13 connected to a FPCB 205. As in the example described above, when the COF bonding is used, the other end of the film 201 mounted with the driver IC 200 may be electrically connected to the FPCB 205 as shown in FIG. 36.

The FPCB 205 connected to the film 201 mounted with the driver IC 200 may be electrically connected to the driving board 501 to transmit a timing control signal, image data, and the like output from the driving board 501 to the driver IC 200.

In addition, the first substrate 13 may be connected to an FPCB configured to receive power, and the FPCB for supplying power may be electrically connected to the power board 601 to supply a supply voltage $V_{DD}$ or a reference voltage $V_{SS}$ to the micro-pixel controller 130 or the micro-pixel package 100.

The method of manufacturing a display module according to an embodiment may include all of the above-described processes but may also include only some of the process. Alternatively, any other processes may further be added to the method. For example, the process of connecting the driver IC (1040) and the process of connecting the FPCB (1050) may be omitted.

A display apparatus 1 having a large-area screen may be manufactured by tiling the plurality of display modules 10 fabricated according to the above-described processes.

Figure 37:
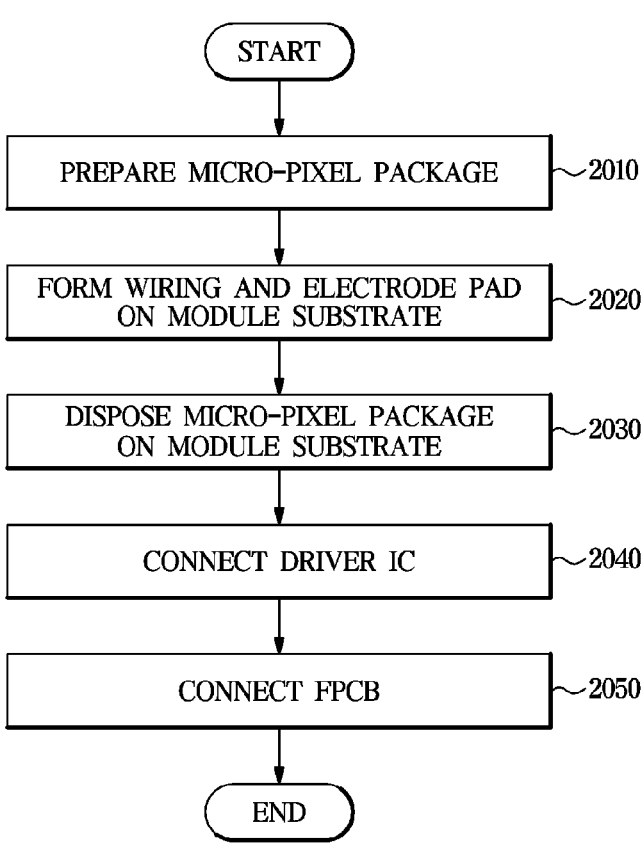
FIG. 37 is a flow chart of a method of manufacturing a display module according to an embodiment when a micro-pixel controller and an inorganic LED are implemented as a single package.

FIG. 37 is a flow chart of a method of manufacturing a display module according to an embodiment when a micro-pixel controller and an inorganic LED are implemented as a single package.

Referring to FIG. 37, a micro-pixel package is fabricated (2010). The micro-pixel package 100 has a package configuration in which a plurality of inorganic LEDs 120 and a micro-pixel controller 130 configured to control the same are integrated, and fabrication processes will be described in more detail below.

Because the inorganic LED 120 and the micro-pixel controller 130 are provided as a single package, reliability of a test for the pixel circuits or the inorganic LEDs may be improved and the test may be performed quickly, and defective products may be easily replaced by mounting only packages having passed the test on the module substrate.

Wirings and electrode pads may be formed on the module substrate (operation 2020).

The wirings and electrode pads may be formed on the upper surface of the first substrate 13 for electrical connection to the micro-pixel package 100 and may also be formed on the lower surface of the first substrate 13 for connection to the driver IC 200, the driving board 501, and the power board 601. In addition, a side wiring may be formed on the side surface of the first substrate 13 or a VIA hole wiring penetrating the first substrate 13 may be formed for connection of the upper wiring to the lower wiring.

The micro-pixel package may be disposed on the module substrate on which the wirings and the electrode pads are formed (operation 2030).

For example, the micro-pixel package 100 may be disposed on the first substrate 13 by electrically connecting the lower electrode pad 112 provided under the micro-pixel package 100 to the upper connection pad 13P1 formed on the upper surface of the first substrate 13. The upper connection pad 13P1 of the first substrate 1 may be electrically connected to the lower electrode pad 112 of the micro-pixel package 100 by soldering or using a conductive adhesive.

The driver IC may be connected to the module substrate (2040) and the FPCB is connected to the driver IC (operation 2050).

Because connection processes of the driver IC and the FPCB are as described above in the above-described flowchart, descriptions thereof will be omitted.

Figure 38:
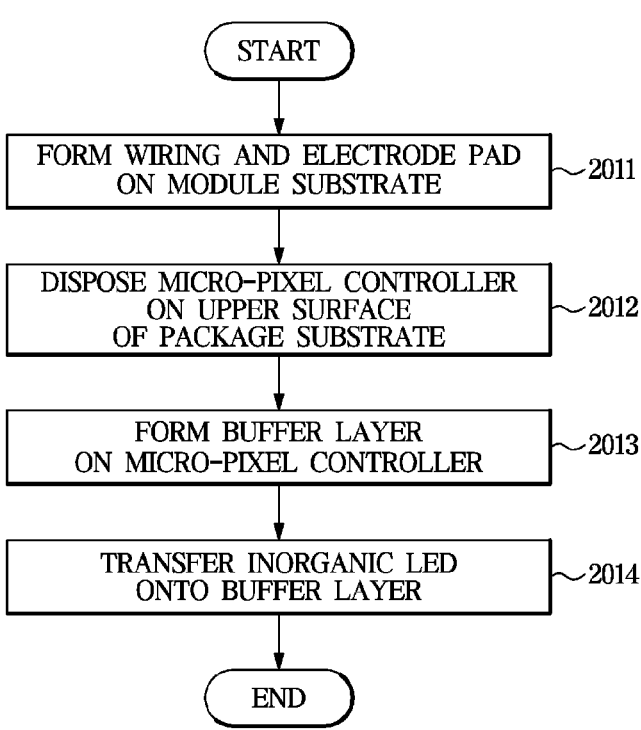
FIG. 38 is a flowchart for describing a method of fabricating a micro-pixel package in a method of manufacturing a display module according to an embodiment.
Figure 39:
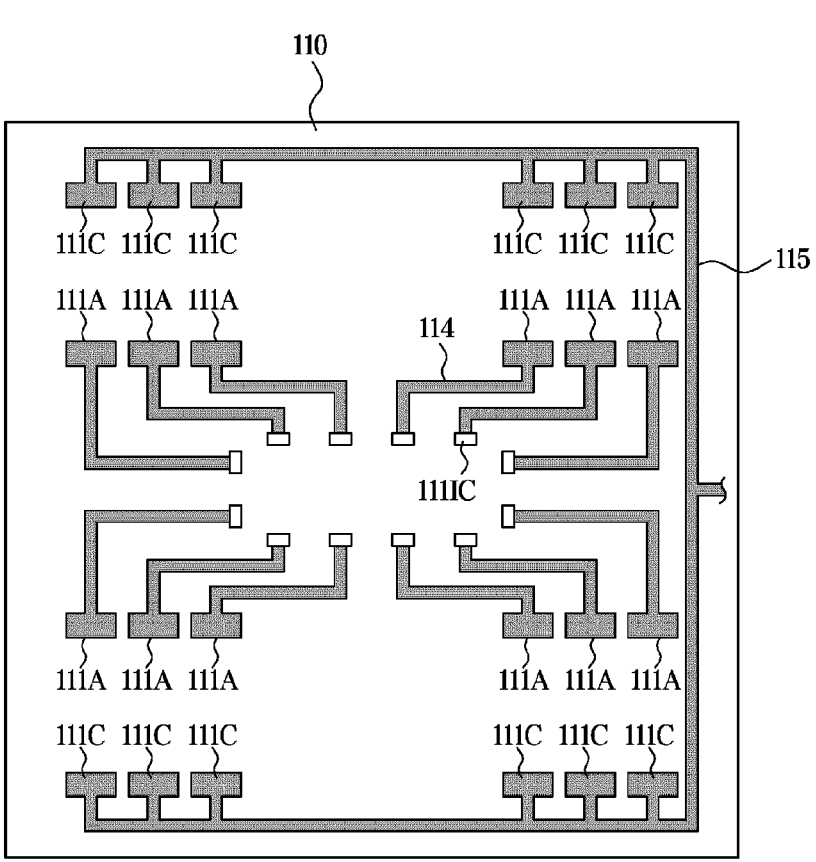
FIGS. 39 to 41 are diagrams illustrating a display module manufactured by some processes shown in FIG. 38 according to an embodiment.
Figure 40:
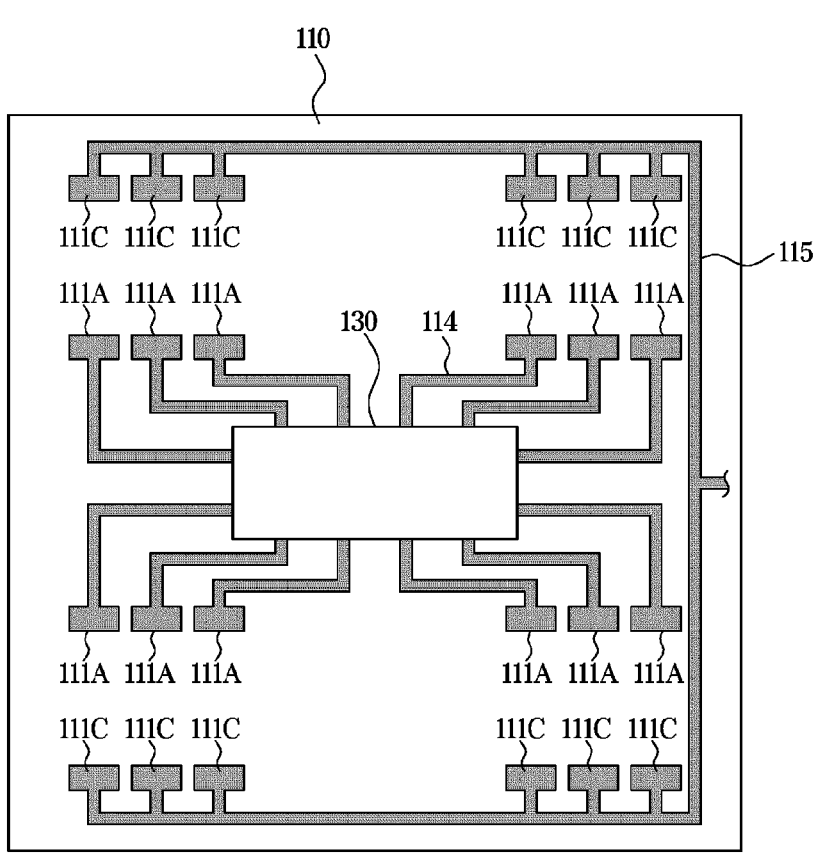
Figure 41:
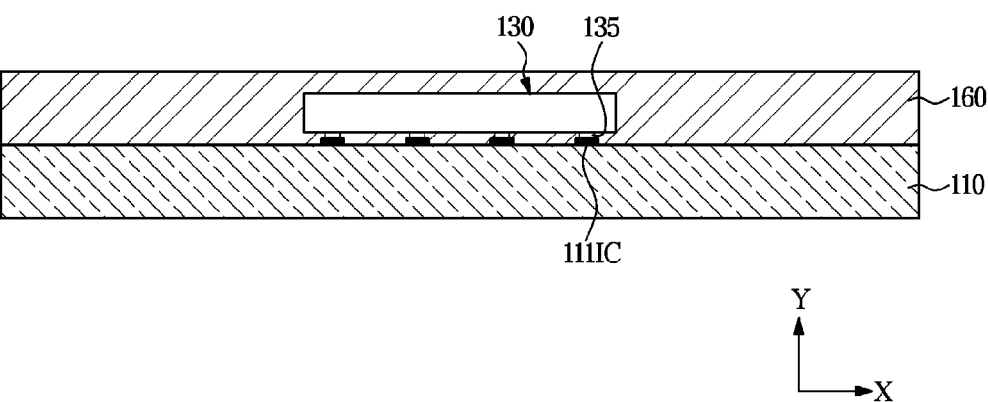

FIG. 38 is a flowchart of a method of fabricating a micro-pixel package in a method of manufacturing a display module according to an embodiment. FIGS. 39 to 41 are diagrams illustrating a display module manufactured by some processes shown in FIG. 38.

Referring to FIGS. 38 and 39, wirings and electrode pads are formed on a package substrate (operation 2011).

The package substrate refers to the above-described second substrate 110, and the wirings and electrode pads may be formed on the upper surface of the second substrate 110. For example, the wirings and the electrode pads may be formed by forming a layer of a metal material such as copper on the upper surface of the second substrate 110 and performing a photolithography process including application, exposure, and development of a photosensitive material and an etching process to selectively remove unnecessary portions.

FIG. 39 is a diagram illustrating the upper surface of the second substrate 110 on which the wirings and the electrode pads are formed according to an embodiment. According to the above-described processes, the upper electrode pad 111IC for connection to the micro-pixel controller 130 and the anode pad 111A for connection to the anode 121 of the inorganic LED 120 may be formed on the upper surface of the second substrate 110. Also, the upper electrode pad 111IC for connection to the micro-pixel controller 130 and the upper wiring 114 for connection of the anode pad 111A to the inorganic LED 120 may be formed thereon.

In addition, the cathode pad 111C for connection to the cathode 122 of the inorganic LED 120 may be formed on the upper surface of the second substrate 110 and the cathode wiring 115 for connection of the cathode pad 111C to the FPCB for supplying powder may be formed thereon.

Referring to FIGS. 38 and 40, the micro-pixel controller may be disposed on the upper surface of the package substrate (operation 2012).

FIG. 40 is a diagram illustrating a micro-pixel package in which a micro-pixel controller is formed on the upper surface of the package substrate on which wirings and electrode pads are formed according to an embodiment. In the same manner as in the previous embodiment, the micro-pixel controller 130 includes a third substrate 132, a pixel circuit 131 disposed on the third substrate 132, and a connection pin 135 for input and output of a signal.

The micro-pixel controller 130 may be disposed on the upper surface of the second substrate 110 by electrically connecting the connection pin 135 provided on the lower surface of the third substrate 132 to the upper electrode pad 111IC provided on the upper surface of the second substrate 110. The connection pin 135 may be connected to the upper electrode pad 111IC by soldering or using a conductive adhesive.

Referring to FIGS. 38 and 41, a buffer layer may be formed on the micro-pixel controller (operation 2013).

FIG. 41 is a side cross-sectional view of a micro-pixel package on which a buffer layer is formed. Forming of the buffer layer 160 on the micro-pixel controller 130 may refer to forming the buffer layer 160 on the second substrate 110 on which the micro-pixel controller 130 is disposed, and the formed buffer layer 160 may cover the second substrate 110 and the micro-pixel controller 130.

The buffer layer 160 may be formed of an insulating material. For example, the buffer layer 160 may be formed by depositing an inorganic material such as silicon oxide, silicon nitride, silicon oxynitride, aluminum oxide, aluminum nitride, titanium oxide, or titanium nitride, or an organic material such as polyimide, polyester, or acrylic material on the second substrate 110 on which the micro-pixel controller 130 is disposed. Also, a planarization layer may further be formed on the buffer layer 160.

In addition, an electrode pad 161 described above as shown in FIG. 22 may be formed on the buffer layer 160 for connection to the inorganic LED 120. The electrode pad 161 may be formed by forming a contact hole penetrating the buffer layer 160 by depositing a metal such as copper, aluminum, and molybdenum, which is used to form the electrode pad 161, on the buffer layer 160 having the contact hole, and etching the metal in accordance with a designed shape.

Referring back to FIG. 38, an inorganic LED is transferred onto the buffer layer (operation 2014). In this case, the transfer may be performed such that the light emitting surface of the inorganic LED 120 faces upward and the electrodes electrode 121 and 122 face downward. Any known transfer methods such as methods using a laser, a stamp, and a roller may be used.

After the inorganic LED 120 is transferred, the electrode pad 161 provided on the buffer layer 160 may be electrically connected to the electrodes 121 and 122 of the inorganic LED 120. For electrical connection therebetween, solder balls or a conductive adhesive may be disposed on the electrode pad 161.

When the inorganic LED 120 is disposed on the buffer layer 160, the above-described structure as shown in FIG. 21 is formed. That is, a height h3 from the upper surface of the second substrate 110 to the upper surface of the inorganic LED 120, i.e., to the light emitting surface, may be greater than a height h4 from the upper surface of the second substrate 110 to the upper end of the micro-pixel controller 130. Therefore, loss of viewing angle caused by the micro-pixel controller 130 may be prevented.

The method of preventing the loss of viewing angle by disposing the micro-pixel controller 130 and the inorganic LED 120 on different layers is described above in the flowchart described above. However, as in the embodiment described above with reference to FIG. 19, the micro-pixel controller 130 and the inorganic LED 120 may also be disposed on the same layer of the upper surface of the second substrate 110.

The method of manufacturing a display module illustrated in FIG. 37 may include all of the above-described processes but may also include only some of the process. Alternatively, any other processes may further be added to the method. For example, the process of fabricating the micro-pixel package 100 may be omitted and the process of connecting the driver IC (operation 1040) and the process of connecting the FPCB (operation 1050) may be omitted.

The embodiments have been shown and described above with reference to the accompanying drawings. It will be understood by those of ordinary skill in the art that the present disclosure may be easily modified into other detailed forms without changing the technical principle or essential features of the present disclosure. However, the disclosed embodiments are illustrative and the scope of the present disclosure is not limited thereby.

What is claimed is:

1. A display module including a plurality of pixels arranged in two dimensions, the display module comprising:
   a first substrate;
   a plurality of micro-pixel packages provided on an upper surface of the first substrate, each of the plurality of micro-pixel packages including a second substrate and a plurality of inorganic light emitting diodes (LEDs) provided on the second substrate;
   a plurality of micro-pixel controllers provided on the upper surface of the first substrate and configured to control the plurality of micro-pixel packages; and
   a driver integrated chip (IC) configured to transmit a driving signal to the plurality of micro-pixel controllers,
   wherein upper ends of the plurality of micro-pixel packages are positioned higher than upper ends of the plurality of micro-pixel controllers with respect to the upper surface of the first substrate,
   wherein each inorganic LED of the plurality of inorganic LEDs comprises a light emitting surface, and a pair of electrodes provided on a surface opposite to the light emitting surface,
   wherein each micro-pixel controller of the plurality of micro-pixel controllers comprises:
   a third substrate; and
   at least one thin film transistor (TFT) provided on the third substrate, and
   wherein the at least one TFT is configured to switch the plurality of inorganic LEDs and supply a driving current to the plurality of inorganic LEDs.

2. The display module of claim 1, wherein each pixel of the plurality of pixels comprises two or more inorganic LEDs among the plurality of inorganic LEDs, and wherein the plurality of inorganic LEDs of each micro-pixel package of the plurality of micro-pixel packages form two or more pixels among the plurality of pixels.

3. The display module of claim 1, wherein heights from the upper surface of the first substrate to upper surfaces of the plurality of inorganic LEDs are greater than heights from the upper surface of the first substrate to the upper ends of the plurality of micro-pixel controllers.

4. The display module of claim 1, wherein the second substrate has a thickness that is greater than a thickness of the third substrate.

5. The display module of claim 4, wherein the at least one TFT comprises a low temperature polycrystalline silicon TFT.

6. The display module of claim 5, wherein the second substrate comprises a glass substrate, and the third substrate comprises a silicon substrate.

7. The display module of claim 1, wherein each micro-pixel controller of the plurality of micro-pixel controllers is further configured to control one or more micro-pixel packages adjacent to the micro-pixel controller among the plurality of micro-pixel packages.

8. The display module of claim 1, wherein each micro-pixel package of the plurality of micro-pixel packages is configured to be controlled by one or more micro-pixel controllers adjacent to the micro-pixel package among the plurality of micro-pixel controllers.

9. The display module of claim 1, further comprising a black matrix layer provided on upper surfaces of the plurality of micro-pixel controllers.

10. A display module comprising:
    a first substrate;
    a plurality of micro-pixel packages provided on an upper surface of the first substrate and
    comprising a plurality of pixels arranged in two dimensions; and
    a driver integrated chip (IC) configured to transmit a driving signal to the plurality of micro-pixel packages,
    wherein each micro-pixel package of the plurality of micro-pixel packages comprises:
    a second substrate;
    a plurality of inorganic light emitting diodes (LEDs) provided on a first surface of the second substrate; and
    a micro-pixel controller provided on the first surface of the second substrate and configured to control the plurality of inorganic LEDs,
    wherein lower ends of the plurality of inorganic LEDs are positioned higher than a lower end of the micro-pixel controller with respect to the upper surface of the first substrate, and
    wherein each inorganic LED of the plurality of inorganic LEDs comprises a light emitting surface, and a pair of electrodes provided on a surface opposite to the light emitting surface.

11. The display module of claim 10, wherein each micro-pixel package of the plurality of micro-pixel packages further comprises a buffer layer provided on the micro-pixel controller of the micro-pixel package, and the plurality of inorganic LEDs are provided on the buffer layer.

12. The display module of claim 10, wherein the light emitting surface faces upward, and the pair of electrodes faces downward.

13. The display module of claim 10, wherein each pixel of the plurality of pixels comprises two or more inorganic LEDs among the plurality of inorganic LEDs, and wherein the plurality of inorganic LEDs provided in each micro-pixel package of the plurality of micro-pixel packages form two or more pixels among the plurality of pixels.

* * * * *